United States Patent
Yoneda et al.

(10) Patent No.: US 8,692,222 B2
(45) Date of Patent: Apr. 8, 2014

(54) NONVOLATILE MEMORY ELEMENT AND METHOD OF MANUFACTURING THE NONVOLATILE MEMORY ELEMENT

(75) Inventors: Shinichi Yoneda, Kyoto (JP); Takumi Mikawa, Shiga (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/575,338

(22) PCT Filed: Dec. 12, 2011

(86) PCT No.: PCT/JP2011/006912
§ 371 (c)(1),
(2), (4) Date: Jul. 26, 2012

(87) PCT Pub. No.: WO2012/090404
PCT Pub. Date: Jul. 5, 2012

(65) Prior Publication Data
US 2012/0292589 A1    Nov. 22, 2012

(30) Foreign Application Priority Data

Dec. 27, 2010    (JP) .................................. 2010-291368

(51) Int. Cl.
*H01L 47/00*    (2006.01)

(52) U.S. Cl.
USPC ................. 257/4; 257/2; 257/3; 257/E45.003; 438/14; 438/102; 438/104; 438/381

(58) Field of Classification Search
CPC ......... H01L 45/00; H01L 45/04; H01L 45/06; H01L 45/141
USPC ........... 438/14, 102, 104, 381–382, 675, 696; 257/2–5, 529, E45.003
See application file for complete search history.

(56) References Cited

U.S. PATENT DOCUMENTS

| | | | |
|---|---|---|---|
| 6,287,965 | B1 | 9/2001 | Kang et al. |
| 6,590,251 | B2 | 7/2003 | Kang et al. |

(Continued)

FOREIGN PATENT DOCUMENTS

| | | |
|---|---|---|
| JP | 3-107122 | 5/1991 |
| JP | 2001-217206 | 8/2001 |
| JP | 4088323 | 5/2008 |

(Continued)

OTHER PUBLICATIONS

International Search Report issued Mar. 13, 2012 in corresponding International Application No. PCT/JP2011/006912.

*Primary Examiner* — Mark A Laurenzi
(74) *Attorney, Agent, or Firm* — Wenderoth, Lind & Ponack, L.L.P.

(57) ABSTRACT

A nonvolatile memory element according to the present disclosure includes: a variable resistance element including a first electrode layer, a second electrode layer, and a variable resistance layer which is located between the first electrode layer and the second electrode layer and has a resistance value that reversibly changes based on an electrical signal applied between the first electrode layer and the second electrode layer; and a fixed resistance layer having a predetermined resistance value and stacked together with the variable resistance element. The variable resistance layer includes (i) a first transition metal oxide layer which is oxygen deficient and (ii) a second transition metal oxide layer which has a higher oxygen content atomic percentage than the first transition metal oxide layer. The predetermined resistance value ranges from 70Ω to 1000Ω inclusive.

10 Claims, 17 Drawing Sheets

(56) References Cited

U.S. PATENT DOCUMENTS

| | | | |
|---|---|---|---|
| 7,952,909 B2 | 5/2011 | Inoue et al. | |
| 8,022,502 B2 | 9/2011 | Kanzawa et al. | |
| 8,058,636 B2 | 11/2011 | Osano et al. | |
| 2002/0000598 A1 | 1/2002 | Kang et al. | |
| 2009/0250678 A1* | 10/2009 | Osano et al. | 257/2 |
| 2009/0283736 A1* | 11/2009 | Kanzawa et al. | 257/2 |
| 2010/0080037 A1 | 4/2010 | Inoue et al. | |
| 2011/0051500 A1 | 3/2011 | Takagi et al. | |
| 2011/0059591 A1* | 3/2011 | Chang | 438/381 |
| 2011/0103131 A1* | 5/2011 | Katayama et al. | 365/148 |
| 2011/0122680 A1 | 5/2011 | Ikeda et al. | |
| 2011/0294259 A1 | 12/2011 | Kanzawa et al. | |
| 2012/0074369 A1 | 3/2012 | Osano et al. | |

FOREIGN PATENT DOCUMENTS

| | | |
|---|---|---|
| JP | 2009-4725 | 1/2009 |
| WO | 2008/126365 | 10/2008 |
| WO | 2008/149484 | 12/2008 |
| WO | 2010/064446 | 6/2010 |
| WO | 2010/119671 | 10/2010 |
| WO | 2010/125780 | 11/2010 |

* cited by examiner

NONVOLATILE MEMORY ELEMENT AND METHOD OF MANUFACTURING THE NONVOLATILE MEMORY ELEMENT

TECHNICAL FIELD

The present invention relates to nonvolatile semiconductor elements, methods of manufacturing the same, and design support methods for the nonvolatile memory elements, and particularly to a variable resistance nonvolatile semiconductor memory element which has a resistance value that changes according to an application of a voltage pulse, a method of manufacturing the same, and so on.

BACKGROUND ART

In recent years, along with development of the digital technology, electronic devices such as portable information devices and information home appliances have increasingly higher-level functionalities. There is thus a higher demand on variable resistance elements for an increase in capacity, a reduction in power for writing, an increase in speed for writing/reading, and a longer operating life.

In response to such a demand, it is said that there is a limit on the miniaturization of existing flash memories using floating gates. In contrast, a variable resistance element using a variable resistance layer as a material of a memory unit (i.e., a variable resistance memory) can be composed of a simple-structured memory element represented by a two-terminal variable resistance element (i.e., a nonvolatile memory element), which therefore lays high expectations for further miniaturization, increase in speed, and reduction in power consumption. The variable resistance layer which is used as a material of the memory unit will have resistance changing in value from high resistance to low resistance or from low resistance to high resistance by input of electric pulses or the like, for example. In this case, to obtain stable memory characteristics, it is necessary that two values of low resistance and high resistance be clearly distinguished, a change between low resistance and high resistance be stable at high speed, and these two values be held in a nonvolatile manner.

Thus, various proposals have been made on the nonvolatile memory element in order to realize stable memory characteristics and miniaturization of a memory element. As an example of a variable resistance element included in such a nonvolatile memory element, there is proposed a variable resistance element in which transition metal oxides having different oxygen content atomic percentages are stacked and used as a variable resistance layer. For example, Patent Literature (PTL) 1 discloses a variable resistance element which selectively causing the occurrence of oxidation/reduction reaction in an electrode interface which is in contact with a variable resistance layer having a high oxygen content atomic percentage, to stabilize resistance change. The variable resistance element includes a lower electrode, a variable resistance layer, and an upper electrode, and a memory array is configured from a two-dimensional or three-dimensional array of such variable resistance element. Furthermore, in the variable resistance element, the variable resistance layer is of a stacked structure including a first variable resistance layer and a second variable resistance layer, and the first and second variable resistance layers comprise the same type of transitional metal oxide. Furthermore, the oxygen content atomic percentage of the transition metal oxide comprised in the second variable resistance layer is higher than the oxygen content atomic percentage of the transition metal oxide comprised in the first variable resistance layer. By adopting such a structure, when voltage is applied to the variable resistance element, most of the voltage is applied to the second variable resistance layer which has a higher oxygen content atomic percentage and exhibits a higher resistance value. Furthermore, oxygen, which can contribute to the reaction, is abundant in the vicinity of the interface. Therefore, oxidation/reduction reaction occurs selectively at the interface between the upper electrode and the second variable resistance layer, and stable resistance change can be realized.

CITATION LIST

Patent Literature

[PTL 1]
International Publication No. 2008/149484
[PTL 2]
International Publication No. 2008/126365

SUMMARY OF INVENTION

Technical Problem

However, the above-described conventional nonvolatile memory element has following problems.

When a transition metal oxide such as an oxygen-deficient tantalum oxide layer is used as a variable resistance layer, a stable operation can be obtained by configuring a variable resistance layer with a stacked structure of a layer having a high oxygen content atomic percentage (a high concentration layer) and a layer having a low oxygen content atomic percentage (a low concentration layer). Here, an oxygen-deficient metal oxide refers to a metal oxide having a smaller amount of oxygen content than a metal oxide having a stoichiometric composition. In the case of the above-described tantalum oxide, when its composition is represented by $TaO_x$, the tantalum oxide having a stoichiometric composition is $TaO_{2.5}$ (i.e., $Ta_2O_5$). Thus, the value x of the oxygen-deficient tantalum oxide is $0<x<2.5$. The range of x is different depending on the value of a valance included in the transition metal. The metal oxide having a stoichiometric composition generally exhibits insulating properties. However, the oxygen-deficient metal oxide can exhibit the semiconductor properties.

However, in the case where the variable resistance layer has a stacked structure of the high concentration layer (i.e., the high resistance layer) and the low concentration layer (i.e., the low resistance layer), the initial resistance value upon the first application of electric signals is higher than the resistance value obtained in the high resistance state at the time of a normal change in resistance, because of the high resistance layer in the initial state, which means that without treatment, the application of electric signals (normal electric pulses) will not change the resistance, and no resistance change characteristics can be obtained.

In order to obtain the resistance change characteristics, it is necessary that electric pulses at high voltage be applied to the variable resistance layer in the initial state to form an electrical path in the high resistance layer (i.e., to breakdown the high resistance layer). Such processing is referred to as initial breakdown. Voltage for the electric pulses at high voltage (i.e., the initial breakdown voltage) is higher than voltage for ordinary electric pulses required to change the variable resistance layer serving as a memory from a low resistance state to a high resistance state or from a high resistance state to a low resistance state. To generate such electric pulses at high voltage, it is necessary to provide a special circuit. Thus, there is a problem that the special circuit for generating the electric pulses at high voltage is necessary in addition to the circuit for generating the ordinary electric pulses.

Although this problem could be solved by a reduction in thickness of the high concentration layer of the variable resistance layer, which will lower the voltage for the electric pulses required for the initial breakdown, the reduction in thickness of the high concentration layer of the variable resistance layer is not desirable in the light of the reliability of a nonvolatile memory element and a device using the nonvolatile memory element. Specifically, the reduction in thickness of the high concentration layer of the variable resistance layer in order to lower the voltage for the electric pulses required for the initial breakdown generates variations in the resistance value of the variable resistance element and thus imposes a problem of a decrease in reliability.

The present invention has been made in view of the above circumstances, and has an object to provide a nonvolatile memory element, a method of manufacturing the nonvolatile memory element, and a design support method for the nonvolatile memory element, which can lower the voltage for the electric pulses required for the initial breakdown and reduce variation in resistance value of the nonvolatile memory element.

Solution to Problem

In order to achieve the aforementioned object, a nonvolatile memory element according to a first aspect of the present invention includes: a variable resistance element including a first electrode, a second electrode, and a variable resistance layer which is located between the first electrode and the second electrode and has a resistance value that reversibly changes based on an electrical signal applied between the first electrode and the second electrode; and a fixed resistance layer having a predetermined resistance value, the fixed resistance layer being stacked together with the variable resistance element, wherein the variable resistance layer includes (i) a first transition metal oxide layer which comprises an oxygen-deficient transition metal oxide and (ii) a second transition metal oxide layer which has an oxygen content atomic percentage that is higher than an oxygen content atomic percentage of the first transition metal oxide layer, and the predetermined resistance value ranges from $70\Omega$ to $1000\Omega$ inclusive.

The above-described structure integrally includes the fixed resistance layer that has a fixed resistance value ranging from $70\Omega$ to $1000\Omega$ inclusive. Such a structure makes it possible to lower the voltage for the electric pulses required for the initial breakdown. Note that the voltage for the electric pulses required for the initial breakdown is not lowered, when the fixed resistance layer that has a fixed resistance value ranging from $70\Omega$ to $1000\Omega$ inclusive is not integrally provided, that is, for example, when the fixed resistance layer is external to the variable resistance element.

As described, by integrally including the fixed resistance layer that has a fixed resistance value ranging from $70\Omega$ to $1000\Omega$ inclusive, it is possible to lower the voltage for the electric pulses required for the initial breakdown. Thus, the thickness of the high concentration layer of the variable resistance layer need not be thinner than required for its resistance value. Therefore, it is possible to realize the nonvolatile memory element which can lower the voltage for the electric pulses required for the initial breakdown and reduce variation in resistance value of the nonvolatile memory element.

Here, the first electrode may be disposed on the fixed resistance layer, the first transition metal oxide layer may be disposed on the first electrode, the second transition metal oxide layer may be disposed on the first transition metal oxide layer, the second electrode may be disposed on the second transition metal oxide layer, and the fixed resistance layer may be electrically connected to the variable resistance element.

Furthermore, the fixed resistance layer may be disposed on the second electrode, the second electrode may be disposed on the second transition metal oxide layer, the second transition metal oxide layer may be disposed on the first transition metal oxide layer, the first transition metal oxide layer may be disposed on the first electrode, and the fixed resistance layer may be electrically connected to the variable resistance element.

Furthermore, the second electrode may be disposed on the fixed resistance layer, the second transition metal oxide layer may be disposed on the second electrode, and the first transition metal oxide layer may be disposed on the second transition metal oxide layer, the first electrode may be disposed on the second transition metal oxide layer, and the fixed resistance layer may be electrically connected to the variable resistance element.

Furthermore, the fixed resistance layer may be disposed on the first electrode, the first electrode may be disposed on the first transition metal oxide layer, the first transition metal oxide layer may be disposed on the second transition metal oxide layer, the second transition metal oxide layer may be disposed on the second electrode, and the fixed resistance layer may be electrically connected to the variable resistance element.

Here, it is preferable that the second electrode comprise a material having a standard electrode potential that is higher than both a standard electrode potential of a material comprised in the first electrode and a standard electrode potential of a transition metal comprised in the variable resistance layer.

Furthermore, it is preferable that the variable resistance layer include one transition metal oxide layer which comprises an oxygen-deficient transition metal oxide selected from a tantalum oxide, a hafnium oxide, and a zirconium oxide.

Here, it is preferable that the predetermined resistance value range from $70\Omega$ to $420\Omega$ inclusive.

Furthermore, the fixed resistance layer may comprise titanium aluminum nitride, and the fixed resistance layer may comprise a tantalum oxide.

Furthermore, in order to achieve the aforementioned object, a method of manufacturing a nonvolatile memory element according to an aspect of the present invention includes: forming, above a semiconductor substrate, a fixed resistance layer having a predetermined resistance value ranging from $70\Omega$ to $1000\Omega$ inclusive; forming a first electrode on the fixed resistance layer; forming, on the first electrode, a variable resistance layer comprising (i) a first transition metal oxide which comprises an oxygen-deficient transition metal oxide and (ii) a second transition metal oxide which is an insulator and has an oxygen content atomic percentage that is higher than an oxygen content atomic percentage of the first transition metal oxide; and forming a second electrode on the variable resistance layer.

Furthermore, in order to achieve the aforementioned object, a method of manufacturing a nonvolatile memory element according to an aspect of the present invention includes: forming a first electrode above a semiconductor substrate; forming, on the first electrode, a variable resistance layer comprising (i) a first transition metal oxide which comprises an oxygen-deficient transition metal oxide and (ii) a second transition metal oxide which is an insulator and has an oxygen content atomic percentage that is higher than an oxygen content atomic percentage of the first transition metal oxide; forming a second electrode on the variable resistance layer; and forming, on the second electrode, a fixed resistance layer having a predetermined resistance value ranging from 70Ω to 1000Ω inclusive.

Furthermore, in order to achieve the aforementioned object, a method of manufacturing a nonvolatile memory element according to an aspect of the present invention is a method of manufacturing the nonvolatile memory element according to the first aspect described above, the method includes: determining the predetermined resistance value of the fixed resistance layer; and manufacturing the nonvolatile memory element according to the predetermined resistance value determined in the determining, wherein the determining includes: calculating a dependency relationship between a resistance value of the fixed resistance layer and an initialization voltage of the nonvolatile memory element; receiving the initialization voltage required for a nonvolatile memory element to be designed; specifying the predetermined resistance value of the fixed resistance layer, which corresponds to the initialization voltage received in the receiving, with reference to the dependency relationship calculated in the calculating; and outputting the predetermined resistance value specified in the specifying.

Here, it is preferable that the calculating include: experimentally manufacturing a plurality of nonvolatile memory elements having the fixed resistance layers which have mutually different resistance values, the nonvolatile memory elements including the nonvolatile memory element; measuring and collecting initialization voltages of the nonvolatile memory elements by initializing the nonvolatile memory elements which are manufactured in the experimental manufacturing and have the fixed resistance layers which have mutually different resistance values; and determining, for each of the nonvolatile memory elements, the dependency relationship by associating each of the resistance values of the fixed resistance layers and a corresponding one of the initialization voltages.

Advantageous Effects of Invention

According to the present invention, it is possible to realize a nonvolatile memory element, a method of manufacturing the nonvolatile memory element, and a design support method for the nonvolatile memory element, which can lower the voltage for the electric pulses required for the initial breakdown, reduce variation in resistance value of the nonvolatile memory element, and increase reliability.

Specifically, with a fixed resistance layer stacked (i.e. integrally formed) together with a variable resistance element, compared to the case in which the fixed resistance is separated and connected via a line, a voltage drop attributed to line delay or the like does not occur and it is possible to lower a breakdown voltage by stabilizing a distribution of a voltage applied to the high resistance layer having a high oxygen concentration. This contributes to, in addition to a lowering of the breakdown voltage, a miniaturization and increased capacity of memories.

DESCRIPTION OF EMBODIMENTS

The following describes embodiments of the present invention in detail with reference to the drawings. It should be noted that the same numerals are given to the same or corresponding elements through all the drawings, and a description thereof may be omitted.

Embodiment 1

[Structure of Nonvolatile Memory Element]

Figure 1:
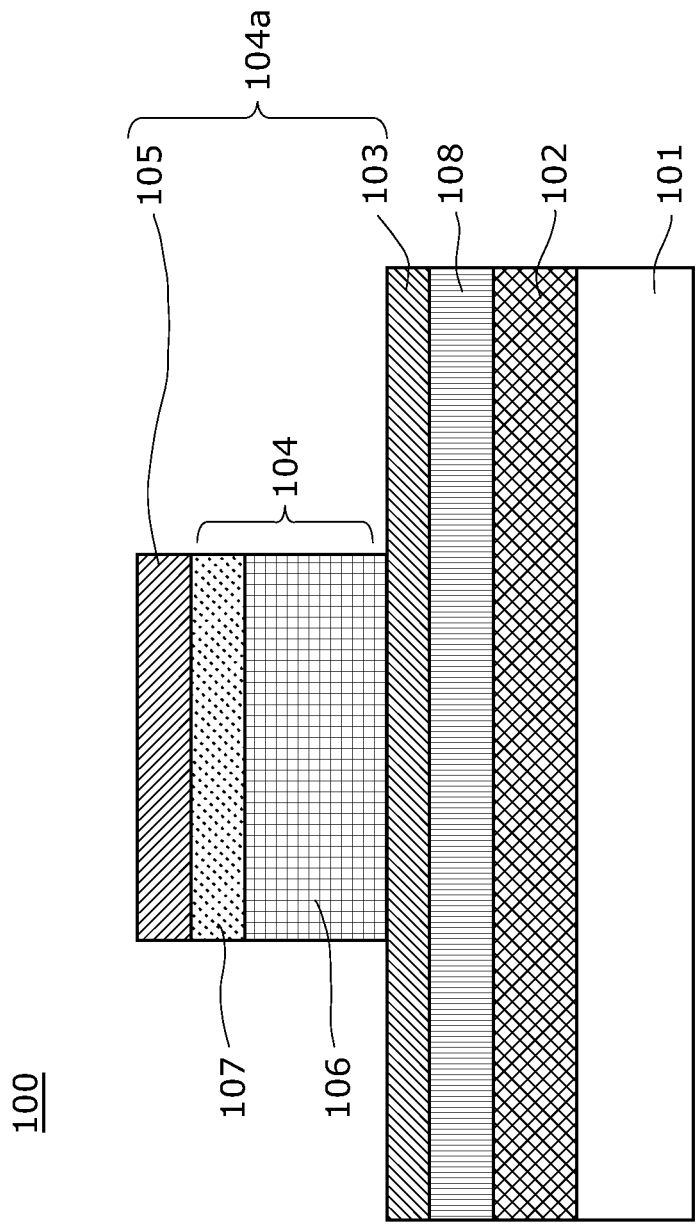
FIG. 1 is a cross-sectional view showing an example structure of a nonvolatile memory element according to Embodiment 1 of the present invention.

FIG. 1 is a cross-sectional view showing an example structure of a nonvolatile memory element according to Embodiment 1 of the present invention.

A nonvolatile memory element 100 shown in FIG. 1 is a variable resistance nonvolatile memory element which includes: a substrate 101, an oxide layer 102 that is an insulating layer formed on the substrate 101; a fixed resistance layer 108 formed on the oxide layer 102; and a variable resistance element 104a formed on the fixed resistance layer 108.

The variable resistance element 104a includes: a first electrode layer 103 that is a first electrode; a second electrode layer 105 that is a second electrode; and a variable resistance layer 104 interposed between a first electrode layer 103 and a second electrode layer 105. For example, as shown in FIG. 1, the first electrode layer 103, the variable resistance layer 104, and the second electrode layer 105 are sequentially stacked on the fixed resistance layer 108.

The variable resistance layer 104 is located between the first electrode layer 103 and the second electrode layer 105, and has a resistance value that reversibly changes based on an electric signal applied between the first electrode layer 103 and the second electrode layer 105. Furthermore, the variable resistance layer 104 includes: a first transition metal oxide layer which comprises an oxygen-deficient transition metal and has a low oxygen content atomic percentage; and a second transition metal oxide layer having a higher oxygen content atomic percentage than the first transition metal oxide layer that has a low oxygen content atomic percentage. Specifically, the variable resistance layer 104 is in contact with the first electrode layer 103 and comprises a transition metal oxide. The variable resistance layer 104 is configured of a stacked structure including at least two layers that are a first transition metal oxide layer 106 comprising an oxygen-deficient transition metal oxide and a second transition metal oxide layer 107 which is in contact with the second electrode layer 105 and comprises a transition metal oxide having a higher oxygen content atomic percentage than the first transition metal oxide layer 106.

The first transition metal oxide layer 106 and the second transition metal oxide layer 107 comprise, for example, a tantalum oxide. Here, when the tantalum oxide comprised in the first transition metal oxide layer 106 is expressed by $TaO_x$, $0<x<2.5$ is satisfied. Furthermore, when the tantalum oxide comprised in the second transition metal oxide layer 107 is expressed by $TaO_y$, $x<y$ is satisfied. In particular, in order to achieve a stable operation as a variable resistance element, it is preferable that $TaO_x$ satisfy $0.8 \leq x \leq 1.9$, and $TaO_y$ satisfy $2.1 \leq y$. Note that $TaO_y$ exhibits insulating properties, when $2.1 \leq y$ is satisfied. $TaO_y$ exhibits ideal insulating properties, when $y=2.5$. Furthermore, the thickness of the first transition metal oxide layer 106 ranges, for example, from approximately 20 nm to 100 nm inclusive, and the thickness of the second transition metal oxide layer 107 ranges, for example, from approximately 2 nm to 12 nm inclusive.

Note that the variable resistance layer 104 (the first transition metal oxide layer 106) configured as described above can be formed at a relatively low substrate temperature and thus can be formed on a resin material or the like.

It is preferable that the second electrode layer 105 (i) be in contact with the second transition metal oxide layer 107, which is included in the variable resistance layer 104 and has a higher oxygen content atomic percentage, and (ii) comprise an electrode material having a standard electrode potential higher than a standard electrode potential of the transition metal comprised in the variable resistance layer 104. An example of such an electrode material is iridium (Ir) with a thickness of 50 nm. Here, the larger a value of the standard electrode potential is, the less susceptible to oxidation.

The first electrode layer 103 is in contact with the first transition metal oxide layer 106, which is included in the variable resistance layer 104 and has a lower oxygen content atomic percentage, and comprises, for example, tantalum nitride (TaN) with a thickness of 100 nm. Note that it is preferable that the material (electrode material) comprised in the first electrode layer 103 be a material having a lower standard electrode potential than the material comprised in the second electrode layer 105. For example, it is preferable that the first electrode layer 103 comprise tungsten (W), nickel (Ni), tantalum (Ta), titanium (Ti), aluminum (Al), tantalum nitride (TaN), titanium nitride (TiN), or the like. The above-described structure allows an oxidation-reduction reaction of the second transition metal oxide layer 107 to selectively occur in the second transition metal oxide layer 107 near the second electrode layer 105, which provides a more stable resistance change characteristics.

The fixed resistance layer 108 has a predetermined resistance value that is higher than a conductor such as ordinary line resistance or the like, and is stacked together with the variable resistance element 104a. Specifically, the fixed resistance layer 108 is formed on the oxide layer 102 and below the first electrode layer 103. Stated differently, the fixed resistance layer 108 is formed on the oxide layer 102, and the variable resistance element 104a (the first electrode layer 103) is stacked on the fixed resistance layer 108. In addition, the fixed resistance layer 108 is electrically connected to the first electrode layer 103 that is the first electrode of the variable resistance element 104a.

The fixed resistance layer 108 comprises, for example, titanium aluminum nitride (TiAlN) with a thickness of 50 nm. The predetermined resistance value (hereinafter also referred to as a "fixed resistance value") of the fixed resistance layer 108 ranges from 70Ω to 1000Ω, and it is preferable that the predetermined resistance value be 100Ω. Note that the fixed resistance layer 108 may comprise a material such as TaN, $TaO_x$, or the like, which makes it easy to control the resistance value to be in the range from 70Ω to 1000Ω.

In FIG. 1, the fixed resistance layer 108 is stacked below the variable resistance element 104a that is the side opposite to the side on which the first electrode layer 103 is in contact with the variable resistance layer 104. However, note that the fixed resistance layer 108 is not limited to such an example. For example, when the first electrode layer 103 comprises (i) tantalum nitride (TaN) that is stacked under the first transition metal oxide layer 106 of the variable resistance layer 104 and (ii) titanium nitride (TiN, a layer adhered to an underlying film) stacked under the TaN, (i.e. having a stacked structure), the fixed resistance layer 108 may be disposed between the TaN and the TiN. In other words, the fixed resistance layer 108 may be disposed above the TiN that is an adhesion layer of the first electrode layer 103 and below the TaN which serves as a part of the first electrode.

The substrate 101 is, for example, a silicon single crystal substrate or a semiconductor substrate, but the substrate 101 is not limited to such examples. Furthermore, the oxide layer 102 comprises, for example, a silicon oxide layer ($SiO_2$), but the oxide layer 102 is not limited to such an example as long as the oxide layer 102 serves as an insulating layer.

To drive the nonvolatile memory element 100, a voltage (an electric signal) satisfying a predetermined condition is applied between the first electrode layer 103 and the second electrode layer 105 by an external power source. According to the voltage application direction (polarity of the voltage), the resistance value of the variable resistance layer 104 of the nonvolatile memory element 100 increases or decreases. For example, when a pulse voltage larger than a predetermined threshold voltage is applied, the resistance value of the variable resistance layer 104 increases or decreases, whereas when a pulse voltage smaller than the predetermined threshold voltage is applied, there is no change in the resistance value of the variable resistance layer 104.

The nonvolatile memory element 100 is configured as described above. In the nonvolatile memory element 100, the fixed resistance layer 108 is formed under the electrode. This makes it possible to lower the initial breakdown voltage. Note that the voltage for the electric pulses required for the initial breakdown is not lowered, when the fixed resistance ranging from 70Ω to 1000Ω inclusive is not integrally provided, that is, for example, when the fixed resistance is external to the variable resistance element. As described, in the nonvolatile memory element 100 according to this embodiment, the fixed resistance layer 108 is formed under the electrode. This makes is possible to lower the voltage for the electric pulses required for the initial breakdown, and the thickness of the high concentration layer (the second transition metal oxide layer 107) of the variable resistance layer need not be thinner than required. Thus, it is possible to reduce variation in resistance value of the nonvolatile memory element 100. Therefore, it is possible to lower the voltage for the electric pulses required for the initial breakdown, and reduce variation in resistance value of the nonvolatile memory element.

Furthermore, the nonvolatile memory element 100 can stably perform resistance change operation, by forming in advance the variable resistance layer 104 with a stacked structure including at least two layers that are (i) the first transition metal oxide layer 106 having a low oxygen content atomic percentage and (ii) the second transition metal oxide layer 107 having a high oxygen content atomic percentage.

The above contributes to, in addition to a lowering of the breakdown voltage, a miniaturization and increased capacity of memories.

[Method of Manufacturing Nonvolatile Memory Element]

Next, a method of manufacturing the nonvolatile memory element 100 configured as described above shall be described.

Figure 2:
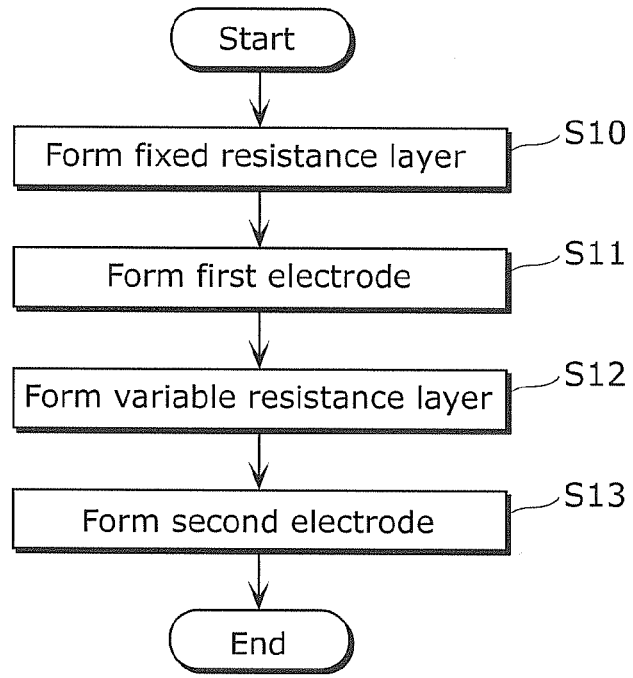
FIG. 2 is a flowchart for describing a method of manufacturing the nonvolatile memory element according to Embodiment 1 of the present invention.

FIG. 2 is a flowchart for describing a method of manufacturing the nonvolatile memory element according to Embodiment 1 of the present invention.

First, the fixed resistance layer having a predetermined resistance value is formed above the semiconductor substrate (S10). Specifically, on the substrate 101, the oxide layer 102, which has a thickness of 200 nm, comprises $SiO_2$, and serves as an insulating layer, is formed with a thermal oxidation method or a CVD method. Then, as the fixed resistance layer 108, a TiAlN thin-film having a thickness of 50 nm is formed on the oxide layer 102. Here, the resistance value of the fixed resistance layer is approximately 100Ω.

Next, a first electrode is formed on the fixed resistance layer (S11). Specifically, as the first electrode layer 103, a TaN thin-film having a thickness of 100 nm is formed on the fixed resistance layer 108.

Next, a variable resistance layer is formed on the first electrode. The variable resistance layer comprises (i) a first transition metal oxide which is oxygen deficient and (ii) a second transition metal oxide having a higher oxygen content atomic percentage than the first transition metal oxide (S12). Specifically, for example, first, as the first transition metal oxide layer 106 of the variable resistance layer 104, a first tantalum oxide layer is formed on the first electrode layer 103. The thickness of the first tantalum oxide layer ranges, for example, from approximately 20 nm to 100 nm inclusive. Here, to form the variable resistance layer 104, for example, what is called a reactive RF sputtering method can be employed. For example, a Ta target is sputtered in a mixture of argon and oxygen plasma to deposit a tantalum oxide. For the oxygen content atomic percentage in the tantalum oxide layer, a flow rate of argon and oxygen may be adjusted when the reactive sputtering is performed. This makes it possible to form the oxygen-deficient tantalum oxide layer. Note that a sputtering method which does not use a reactive gas such as $O_2$ may be employed to form the variable resistance layer 104, which is possible by using a tantalum oxide as the target. Subsequently, an oxidation process is performed on the first tantalum oxide layer to form, in the top-most surface layer, a second tantalum oxide layer to have a thickness ranging from 2 nm to 12 nm inclusive. The second tantalum oxide layer is formed as the second transition metal oxide layer 107 having a higher oxygen content atomic percentage. The variable resistance layer 104 is thus formed on the first electrode layer 103 such that the transition metal oxide comprised in the variable resistance layer 104 has a stacked structure including a plurality of layers (the first transition metal oxide layer 106 and the second transition metal oxide layer 107) having a mutually different oxygen concentration.

Lastly, the second electrode is formed on the variable resistance layer (S13). Specifically, as the second electrode layer 105, an iridium layer having a thickness of 50 nm is formed on the variable resistance layer 104 with a DC sputtering method.

The nonvolatile memory element 100 is manufactured as described above.

[Initial Breakdown Voltage of Nonvolatile Memory Element]

Next, an initial breakdown voltage of the nonvolatile memory element 100 is described.

Figure 3:
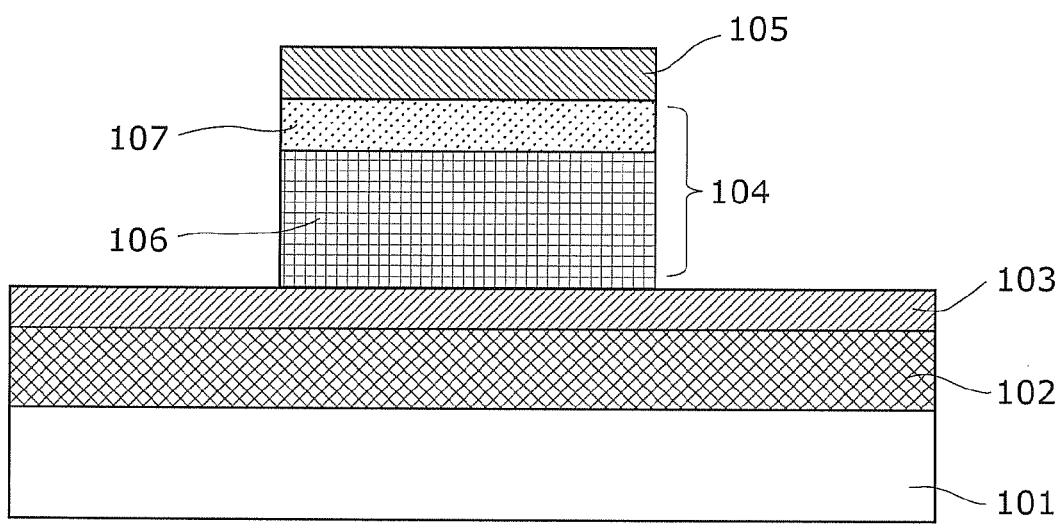
FIG. 3 is a cross-sectional view showing an example structure of a conventional nonvolatile memory element.
Figure 4:
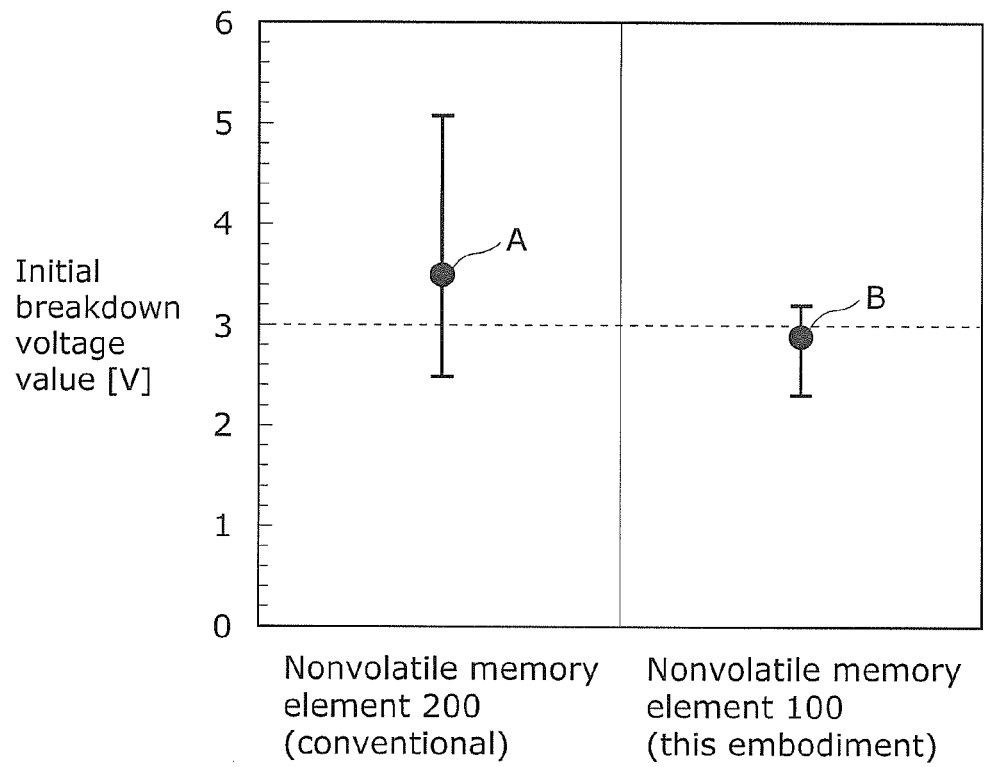
FIG. 4 is a comparison diagram showing initial breakdown voltages of the nonvolatile memory element according to Embodiment 1 of the present invention and the conventional nonvolatile memory element.

FIG. 3 is a cross-sectional view showing an example structure of a conventional nonvolatile memory element. Note that the elements same as the elements in FIG. 1 are given the same numerical references, and thus detailed descriptions thereof are omitted. FIG. 4 is a comparison diagram showing initial breakdown voltages of the nonvolatile memory element according to Embodiment 1 of the present invention and the conventional nonvolatile memory element.

The right portion of FIG. 4 shows an initial breakdown voltage (B in the drawing) and its variation of the nonvolatile memory element 100 according to this embodiment. The left portion of FIG. 4 shows an initial breakdown voltage (A in the drawing) and its variation of a conventional nonvolatile memory element 200 which is shown in FIG. 3 and does not have the fixed resistance layer. In other words, FIG. 4 is a graph which compares (i) the initial breakdown voltage of the nonvolatile memory element 100 having a structure in which the fixed resistance layer 108 is integrally formed and (ii) the initial breakdown voltage of the conventional nonvolatile memory element having a structure which does not include the fixed resistance layer. Note that the vertical axis in FIG. 4 indicates the initial breakdown voltage value (V).

FIG. 4 shows that the nonvolatile memory element 200 having a conventional structure that does not include the fixed resistance layer requires a high initial breakdown voltage, and variation in the initial breakdown voltage is large. In contrast, as compared to the nonvolatile memory element 200 having the conventional structure, the nonvolatile memory element 100 that integrally includes the fixed resistance has the initial breakdown voltage which is about 0.5 V lower on average overall and variation in the voltage is a half or less.

Figure 5:
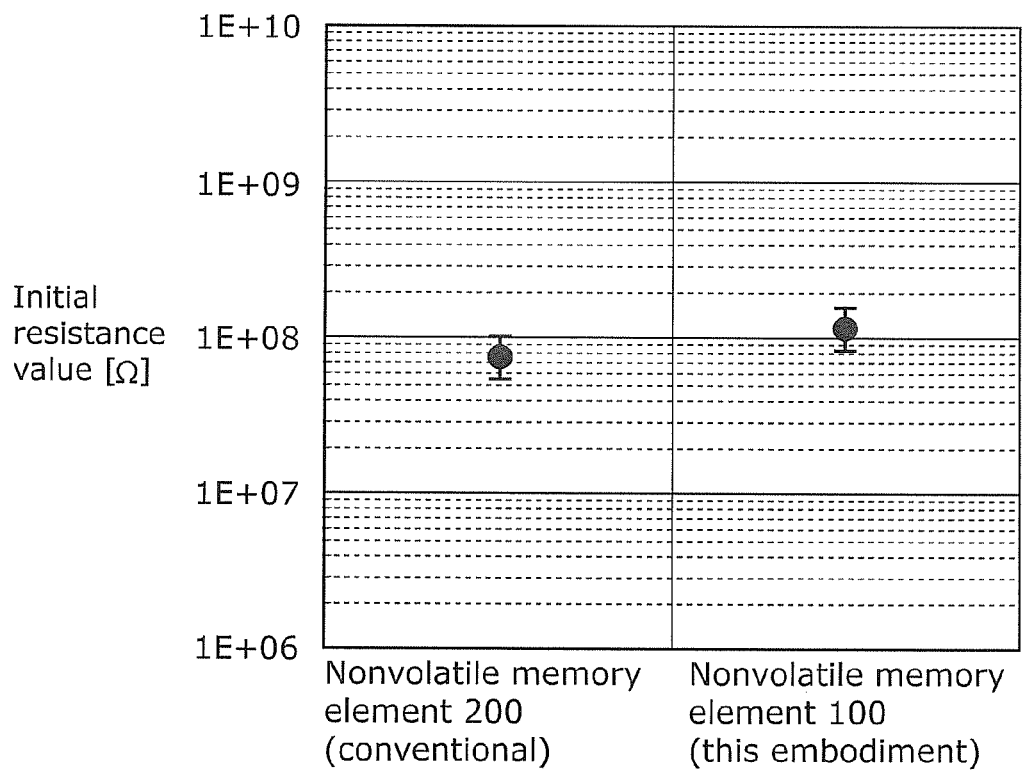
FIG. 5 is a comparison diagram showing initial resistances and variation of the initial resistances of the nonvolatile memory element according to Embodiment 1 of the present invention and the conventional nonvolatile memory element.

FIG. 5 is a comparison diagram showing initial resistances and variation of the initial resistances of the nonvolatile memory element according to Embodiment 1 of the present invention and the conventional nonvolatile memory element 200 that does not have the fixed resistance layer. The right portion of FIG. 5 shows the initial resistance of the nonvolatile memory element 100 according to this embodiment. The left portion of FIG. 5 shows the initial resistance of the conventional nonvolatile memory element 200. Note that the vertical axis in FIG. 5 indicates the initial resistance value ($\Omega$). FIG. 5 shows that, as for the initial resistance value, there are no significant differences between Embodiment 1 and the conventional structure in a magnitude and variation of a resistance value.

From the above, it is shown that the nonvolatile memory element 100 in which the fixed resistance layer 108 is stacked can lower the initial breakdown voltage and reduce variation in the initial breakdown voltage, without causing the initial resistance to vary.

[Range of Fixed Resistance Value]

Figure 6:
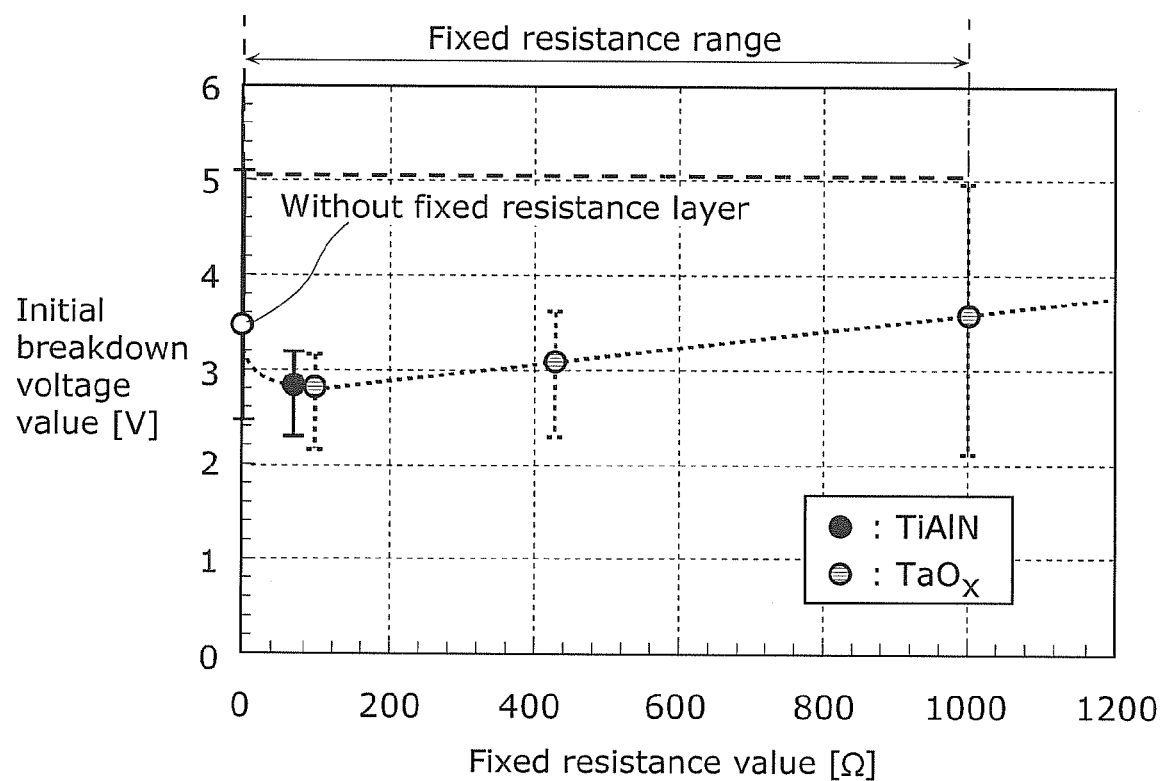
FIG. 6 is a diagram showing a relationship between the fixed resistance value and the initial breakdown voltage of the nonvolatile memory element according to Embodiment 1 of the present invention.

FIG. 6 is a diagram showing a relationship between the fixed resistance value and the initial breakdown voltage of the nonvolatile memory element according to Embodiment 1 of the present invention. Here the vertical axis indicates the initial breakdown voltage value (V), and the horizontal axis indicates the fixed resistance value ($\Omega$). The fixed resistance value refers to a predetermined resistance value of the fixed resistance layer 108.

FIG. 6 shows the result of experiments and shows the fixed resistance value of the fixed resistance layer 108, which is stacked together with the nonvolatile memory element 100, and the initial breakdown voltage and its variation of the fixed resistance layer 108. In the experiment, a titanium aluminum nitride (TiAlN) and an oxygen-deficient tantalum oxide (TaO$_x$) are used as materials of the fixed resistance layer 108, and the fixed resistance values are changed. FIG. 6 shows the initial breakdown voltage value when the resistance value of TiAlN is 70$\Omega$, and the resistance values of the TaO$_x$ are 100$\Omega$, 420$\Omega$, and 1000$\Omega$. Furthermore, FIG. 6 also shows the initial breakdown voltage and its variation of the case in which the fixed resistance layer 108 is not included (i.e., the fixed resistance value is 0$\Omega$).

The nonvolatile memory element according to Embodiment 1 of the present invention has an initial resistance value of approximately $10^8\Omega$ or greater, a resistance value of approximately $10^5\Omega$ in a high resistance state after the initial breakdown, and a resistance value of approximately $10^4\Omega$ in a low resistance state. Furthermore, in the initial breakdown, a pair of a positive pulse and a negative pulse is applied between the electrodes of the nonvolatile memory element, and a resistance value is measured. A voltage is gradually increased until the breakdown occurs.

As FIG. 6 shows, when the nonvolatile memory element does not have the fixed resistance layer 108 (when the fixed resistance layer 108 is not provided), variation ranging from approximately 2.5 V to 5.1 V is observed in the value of the initial breakdown voltage. On the other hand, when the fixed resistance layer 108 is provided, both TiAlN and TaO$_x$ have the lowest initial breakdown voltage at around 100$\Omega$. However, conversely, the breakdown voltage increases when the fixed resistance value is further increased. This indicates that the distribution of voltage to the variable resistance element decreases when the fixed resistance value is high and a sufficient voltage is not applied to the variable resistance element. This conversely makes it more difficult to achieve the breakdown. Furthermore, when TaO$_x$ is used as a material of the fixed resistance layer 108, FIG. 6 shows that the initial breakdown voltage is approximately the same at 1000$\Omega$ as the case in which the fixed resistance layer 108 is not provided.

From the result described above, the nonvolatile memory element 100 in which the fixed resistance layer 108 is provided has a range of the fixed resistance value that allows for lowering of the initial breakdown voltage as compared to the nonvolatile memory element 200 which has a conventional structure that does not include the fixed resistance layer, and the range is from 70$\Omega$ to 1000$\Omega$ inclusive. Furthermore, it is more preferable that the range be from 70$\Omega$ to 420$\Omega$ inclusive. The above-described structure makes it possible to lower the initial breakdown voltage and decrease the variation in the initial breakdown voltage to a half or less, as compared to the element structure in which the fixed resistance is not provided.

Although it has been described that the transition metal oxide layer has a stacked structure comprising a tantalum oxide, note that the transition metal oxide layer is not limited to such an example. Alternatively, for example, the transition metal oxide layer may have a stacked structure comprising a hafnium (Hf) oxide, a stacked structure comprising a zirconium (Zr) oxide, or the like. Such stacked structures have initial resistance approximate to the order ($10^7$ to $10^8\Omega$) of initial resistance value of the stacked structure comprising the tantalum oxide shown in FIG. 5, and thus it is considered that the similar advantageous effects is produced.

[Resistance Change Characteristics of Nonvolatile Memory Element]

Next, resistance change characteristics observed when electric pulses are applied to the nonvolatile memory element 100 is described. In the following, it is assumed that a material comprised in the fixed resistance layer 108 is TiAlN, and the resistance value of the fixed resistance layer 108 is approximately 100$\Omega$. Furthermore, the following describes the case in which the variable resistance layer 104 has a thickness of approximately 50 nm (out of 50 nm, the thickness of the second transition metal oxide layer 107 is 5 nm) and its shape has a diameter of 0.5 μm. Note that the variable resistance layer 104 has the above-described size, unless otherwise described.

Figure 7:
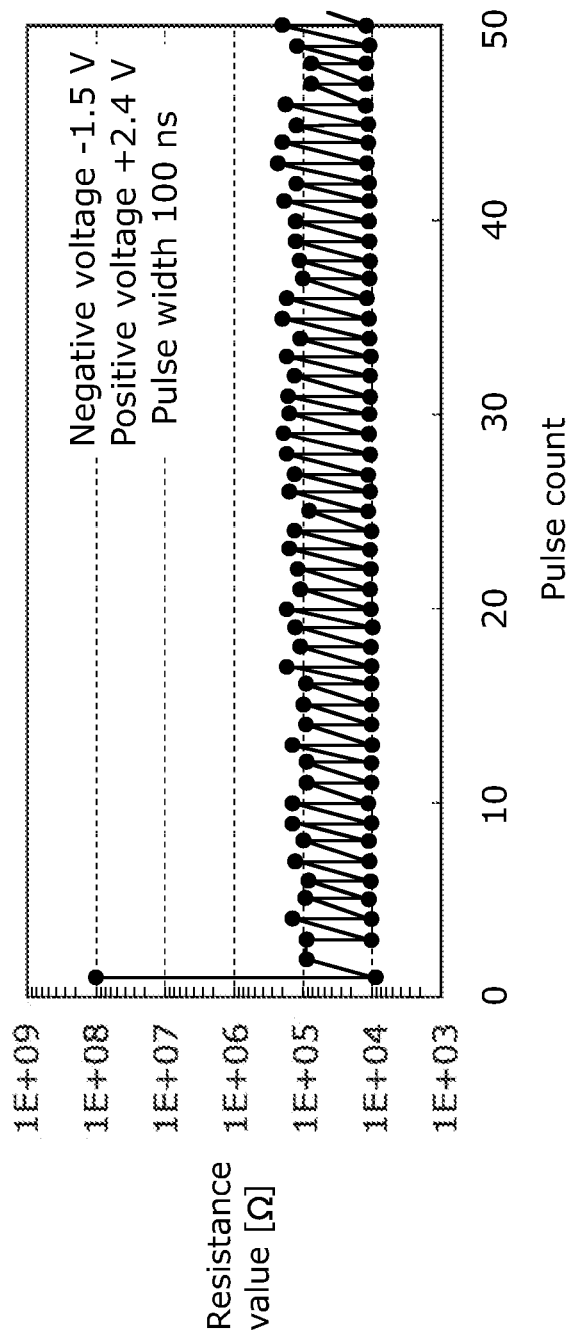
FIG. 7 is a diagram showing a relationship between resistance value of a variable resistance layer of the nonvolatile memory element according to Embodiment 1 of the present invention and the number of applied pulses.

FIG. 7 is a diagram showing a relationship between a resistance value of the variable resistance layer of the nonvolatile memory element according to Embodiment 1 of the present invention and the number of applied pulses. FIG. 7 shows a change in the resistance value that is observed when two types of electric pulses, which have pulse widths of 100 ns and mutually different polarities, are alternately applied between the first electrode layer 103 and the second electrode layer 105.

The resistance value of the variable resistance layer 104 reversibly changes by alternately applying the two types of electric pulses between the electrodes (the first electrode layer 103 and the second electrode layer 105). Specifically, in FIG. 7, first, a negative initial breakdown voltage pulse (−4.1 V, 100 ns) is applied to the nonvolatile memory element having a resistance value of $10^8\Omega$ in an initial resistance state so as to cause the nonvolatile memory element to be in a low resistance state having a resistance value of approximately 10 kΩ. Next, a positive voltage pulse (+2.4 V, 100 ns) is applied so that the nonvolatile memory element shifts back to a high resistance state having a resistance value of approximately 100 kΩ. Subsequently, the resistance value of the variable resistance layer 104 decreases to 10 kΩ (1E+04Ω, low resistance value) when a negative voltage pulse (voltage −1.5 V, pulse width 100 ns) is applied between the electrodes, and the resistance value of the variable resistance layer 104 increases to 100 kΩ (1E+05Ω, high resistance value) when a positive voltage pulse (voltage +2.4 V, pulse width 100 ns) is applied between the electrodes. Note that the "positive voltage" refers to the case in which a positive voltage is applied to the second electrode layer 105 with reference to the first electrode layer 103, and the "negative voltage" refers to the case in which a negative voltage is applied to the second electrode layer 105 with reference to the first electrode layer 103. The definition is the same in the following description, too.

FIG. 7 shows that the nonvolatile memory element 100 changes between a low resistance value and a high resistance value, exhibiting stable resistance change characteristics.

Note that, here, a high initial breakdown voltage of −4.1 V is applied because the initial breakdown voltage is set to a rather high voltage value considering a margin for variation in a voltage for the initial breakdown of each of memory cells in a memory array.

Figure 8:
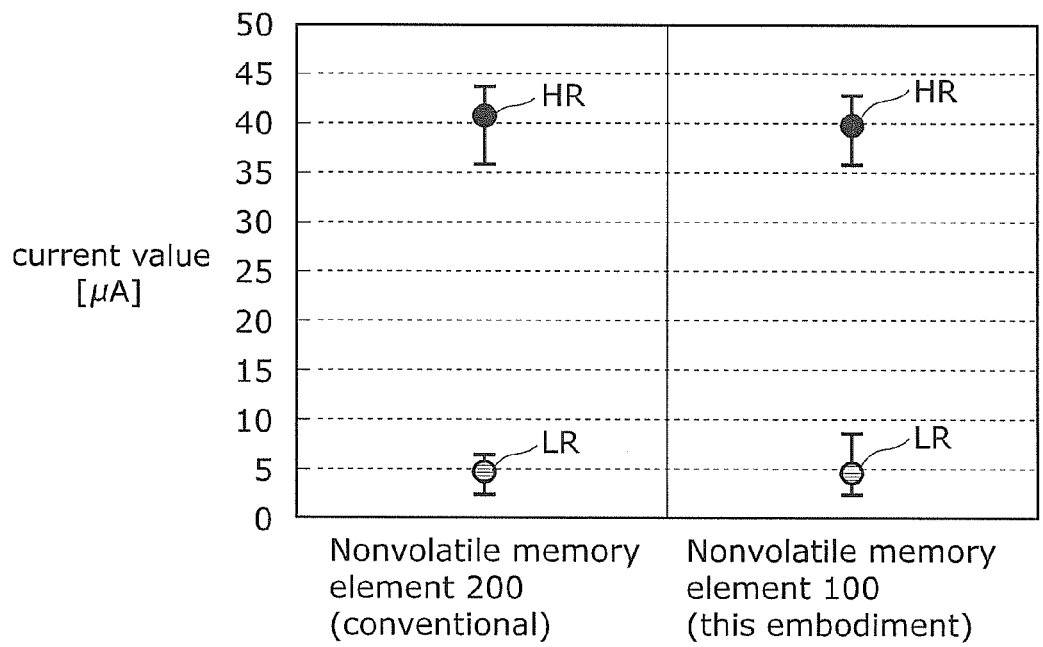
FIG. 8 is a diagram showing changes in resistance value of the nonvolatile memory element according to Embodiment 1 of the present invention and the conventional nonvolatile memory element.

FIG. 8 is a diagram showing changes in resistance values of the nonvolatile memory element according to Embodiment 1 of the present invention and the conventional nonvolatile memory element. The right portion of FIG. 8 shows a change in a resistance value of the variable resistance layer 104 of the nonvolatile memory element 100. The left portion of FIG. 8 shows a change in a resistance value of the variable resistance layer 104 of the conventional nonvolatile memory element 200 that does not have the fixed resistance layer. Note that the vertical axis in FIG. 8 indicates the current value (μA).

As shown in FIG. 8, at the current value in a low resistance state (10 kΩ) (LR current value) and at the current value in a high resistance state (100 kΩ) (HR current value), there is no significant difference between the conventional nonvolatile memory element 200 and the nonvolatile memory element 100 in this embodiment. For both of the nonvolatile memory elements, the LR current value is approximately 40 μA and the HR current value is approximately 5 μA.

The above indicates that the structure in the nonvolatile memory element 100, that is, the structure in which the fixed resistance layer 108 is stacked together with the variable resistance element 104a does not have adverse effect on the resistance change characteristics.

[Operation Example of Nonvolatile Memory Element]

Next, an operation example of the nonvolatile memory element 100 in this embodiment as a memory, that is, an operation example of the cases when writing/reading of information is performed is described with reference to the drawings.

Figure 9:
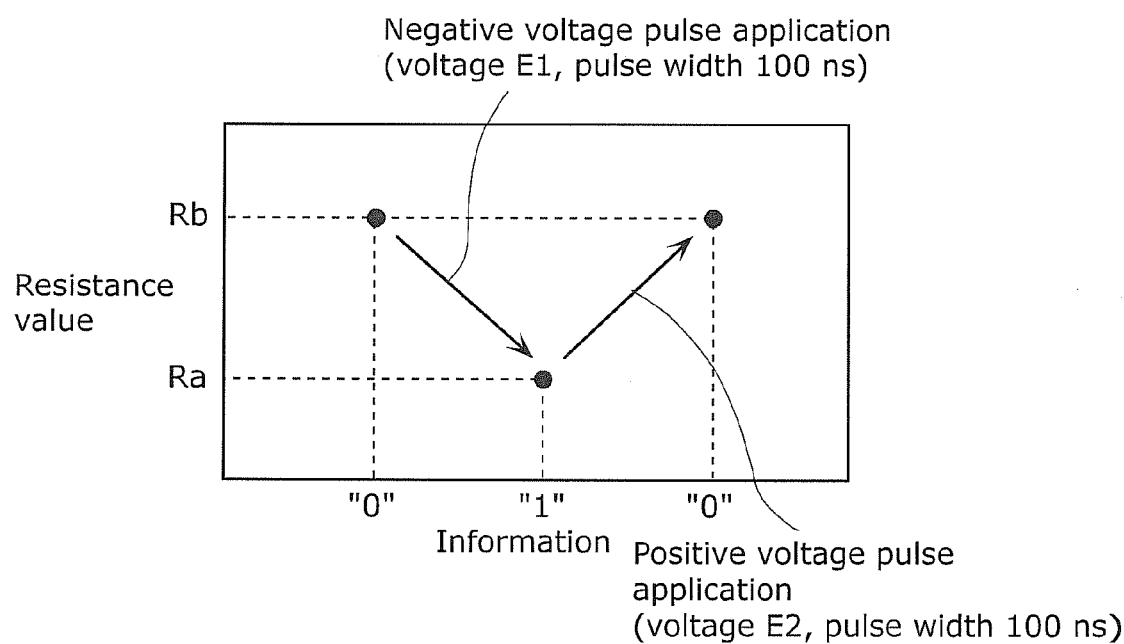
FIG. 9 is a diagram showing an operation example in the case of writing information into the nonvolatile memory element according to Embodiment 1 of the present invention.

FIG. 9 is a diagram showing an operation example in the case of writing information into the nonvolatile memory element according to Embodiment 1 of the present invention.

In the nonvolatile memory element 100, as shown in FIG. 9, when two types of electric pulses, which have amplitudes greater than or equal to a predetermined threshold voltage, pulse widths of 100 ns, and mutually different polarities, are alternately applied between the first electrode layer 103 and the second electrode layer 105, a resistance value of the variable resistance layer 104 changes. Specifically, when a negative voltage pulse (voltage E1, pulse width 100 ns) is applied between the electrodes (the first electrode layer 103 and the second electrode layer 105), the resistance value of the variable resistance layer 104 decreases from a high resistance value Rb to a low resistance value Ra. On the other hand, when a positive voltage pulse (voltage E2, pulse width 100 ns) is applied between the electrodes, the resistance value of the variable resistance layer 104 increases from the low resistance value Ra to the high resistance value Rb. Here, voltage E1 is, for example, −1.5 V, and voltage E2 is, for example, +2.4 V.

In the example shown in FIG. 9, the high resistance value Rb and the low resistance value Ra are assigned to information "0" and information "1", respectively. Thus, the information "0" is written by applying the positive voltage pulse between the electrodes so that the resistance value of the variable resistance layer 104 changes into the high resistance value Rb, and the information "1" is written by applying the negative voltage pulse between the electrodes so that the resistance value of the variable resistance layer 104 changes into the low resistance value Ra.

Figure 10:
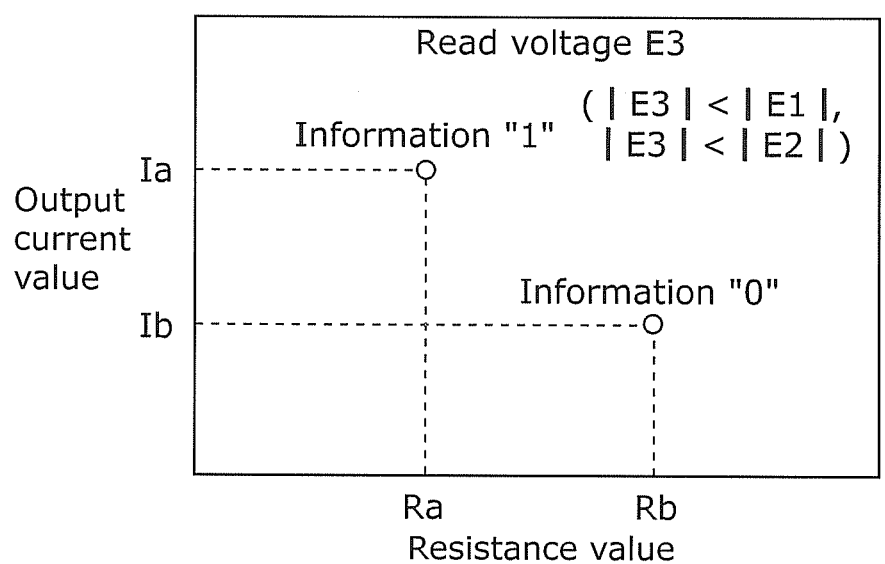
FIG. 10 is a diagram showing an operation example when information in the nonvolatile memory element according to Embodiment 1 of the present invention is read.

FIG. 10 is a diagram showing an operation example when information in the nonvolatile memory element according to Embodiment 1 of the present invention is read.

In the nonvolatile memory element 100, as shown in FIG. 10, when the information is read, a read voltage E3 (|E3|<|E1|, |E3|<|E2|, e.g., 0.5 V), which has an amplitude sufficiently smaller than that of an electric pulse applied to change the resistance value of the variable resistance layer 104, is applied between the electrodes. As a result, a current corresponding to the resistance value of the variable resistance layer 104 is outputted, and detecting a value of the output current enables reading of written information.

In the example shown in FIG. 10, a value of an output current Ia and a value of an output current Ib correspond to the resistance value Ra and the resistance value Rb, respectively. Thus, for example, the information "1" is read when the value of the output current Ia is detected, and, for example, the information "0" is read when the value of the output current Ib is detected.

As described above, the variable resistance layer 104 interposed between the first electrode layer 103 and the second electrode layer 105 serves as a storage unit. This enables the nonvolatile memory element 100 to operate as a memory.

Note that although the nonvolatile memory element 100 includes the variable resistance element 104a in which the first electrode layer 103, the variable resistance layer 104, and the second electrode layer 105 are sequentially stacked on the fixed resistance layer 108 in the above description. However, the nonvolatile memory element 100 is not limited to such an example. Other examples are described with the following variations.

Variation 1

Figure 11:
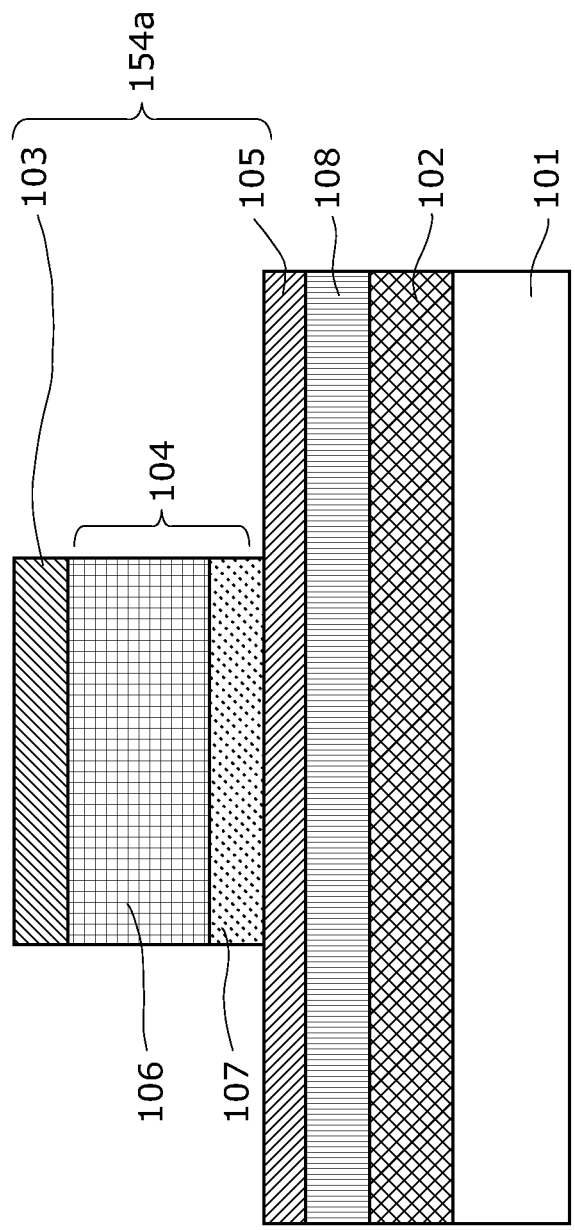
FIG. 11 is a cross-sectional view showing an example structure of a nonvolatile memory element according to Variation 1 of Embodiment 1 of the present invention.

FIG. 11 is a cross-sectional view showing an example structure of the nonvolatile memory element according to Variation 1 of Embodiment 1 of the present invention. Note that the elements same as those in FIG. 1 are given the same numerical references, and the detailed description thereof is omitted.

A nonvolatile memory element 150 shown in FIG. 11 is different from the nonvolatile memory element 100 shown in FIG. 1 in that the nonvolatile memory element 150 includes a variable resistance element 154a that has a structure obtained by vertically flipping the variable resistance element 104a of the nonvolatile memory element 100.

Specifically, the nonvolatile memory element 150 shown in FIG. 11 includes: the oxide layer 102 formed on the substrate 101, the fixed resistance layer 108 formed on the oxide layer 102, and the variable resistance element 154a formed on the fixed resistance layer 108. The variable resistance element 154a includes: the second electrode layer 105 that is a second electrode formed on the fixed resistance layer 108; the variable resistance layer 104 formed on the second electrode layer 105; and the first electrode layer 103 that is a first electrode formed on the variable resistance layer 104. As with Embodiment 1, the variable resistance layer 104 comprises a transition metal oxide, and is configured of a stacked structure including at least two layers which are (i) the first transition metal oxide layer 106 which is in contact with the first electrode layer 103 and comprises an oxygen-deficient transition metal oxide and (ii) the second transition metal oxide layer 107 which is in contact with the second electrode layer 105 and comprises a transition metal oxide having a higher oxygen content atomic percentage than the first transition metal oxide layer 106. The fixed resistance layer 108 has a predetermined resistance value, and stacked together with the variable resistance element 154a. Specifically, the fixed resistance layer 108 is formed on the oxide layer 102 and below the second electrode layer 105.

The nonvolatile memory element 150 is configured as described above.

In the structure according to Variation 1, that is, in the nonvolatile memory element 150, the first transition metal oxide layer 106 that is a low oxygen concentration oxide layer is formed after forming the second transition metal oxide layer 107 that is a high oxygen concentration oxide layer. This produces an advantageous effect, that is, it is easy to suppress a diffusion of oxygen from the second transition metal oxide layer 107 to the first transition metal oxide layer 106.

Note that, in the nonvolatile memory element 150 according to this variation, the second transition metal oxide layer 107 cannot be formed by the method in which the first transition metal oxide layer 106 is oxidized. Therefore, for example, in the reactive sputtering, a transition metal or a transition metal oxide is used as a target. The second transition metal oxide layer 107 having a higher oxygen content atomic percentage is formed by adjusting an oxygen content included in a sputtering gas atmosphere at the time of deposition.

Variation 2

Figure 12:
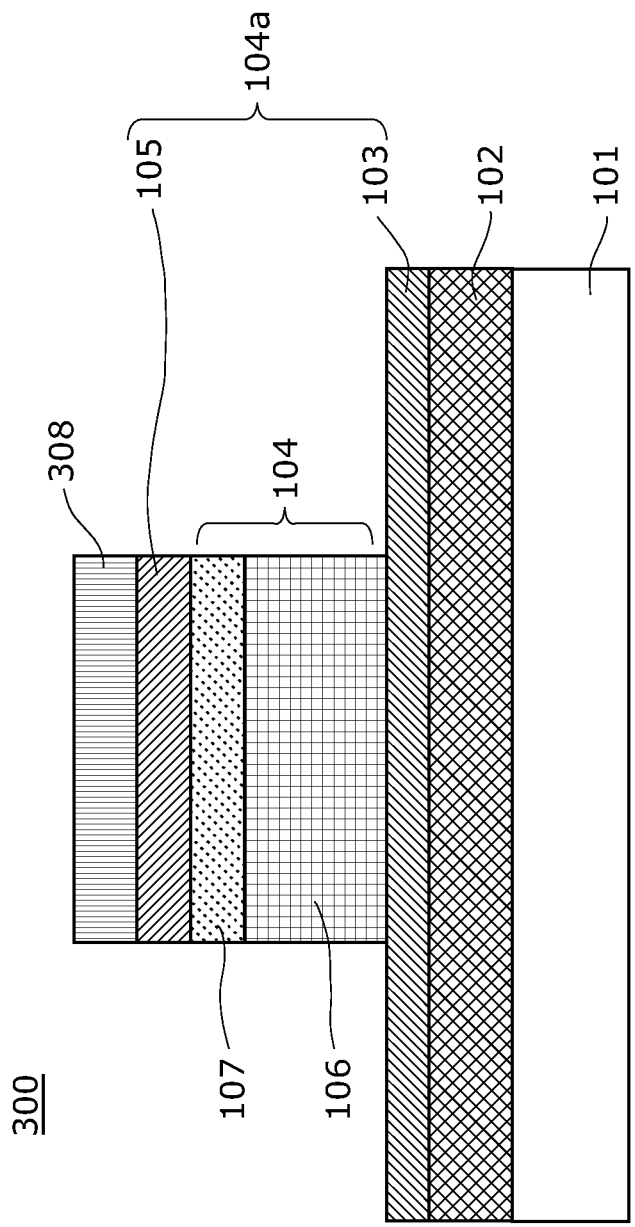
FIG. 12 is a cross-sectional view showing an example structure of a nonvolatile memory element according to Variation 2 of Embodiment 1 of the present invention.

FIG. 12 is a cross-sectional view showing an example structure of the nonvolatile memory element according to Variation 2 of Embodiment 1 of the present invention. Note that the elements same as those in FIG. 1 are given the same numerical references, and the detailed description thereof is omitted.

A nonvolatile memory element 300 shown in FIG. 12 is different from the nonvolatile memory element 100 shown in FIG. 1 in that a fixed resistance layer 308 is stacked on the second electrode layer 105 of the variable resistance element 104a. Specifically, the nonvolatile memory element 300 shown in FIG. 12 includes: the oxide layer 102 formed on the substrate 101; the variable resistance element 104a formed on the oxide layer 102; and the fixed resistance layer 308 formed on the variable resistance element 104a.

As with Embodiment 1, the variable resistance element 104a comprises a transition metal oxide, and includes: the first electrode layer 103, the variable resistance layer 104 formed on the first electrode layer 103; and the second electrode layer 105 formed on the variable resistance layer 104. The variable resistance layer 104 is configured of a stacked structure including at least two layers which are (i) the first transition metal oxide layer 106 which is in contact with the first electrode layer 103 and comprises an oxygen-deficient transition metal oxide and (ii) the second transition metal oxide layer 107 which is in contact with the second electrode layer 105 and comprises a transition metal oxide having a higher oxygen content atomic percentage than the first transition metal oxide layer 106. In addition, the nonvolatile memory element 300 includes, on the second electrode layer 105, the fixed resistance layer 308. Specifically, the fixed resistance layer 308 has a predetermined resistance value and is stacked on the second electrode layer 105 of the variable resistance element 104a.

The nonvolatile memory element 300 is configured as described above.

In the structure according to Variation 2, that is, in the nonvolatile memory element 300, another advantageous effect is produced. The fixed resistance layer 308 serves also as an etch stop layer at the time of forming a via hole for connecting a line to the second electrode layer 105.

Next, a manufacturing method of the nonvolatile memory element 300 configured as described above is described.

Figure 13:
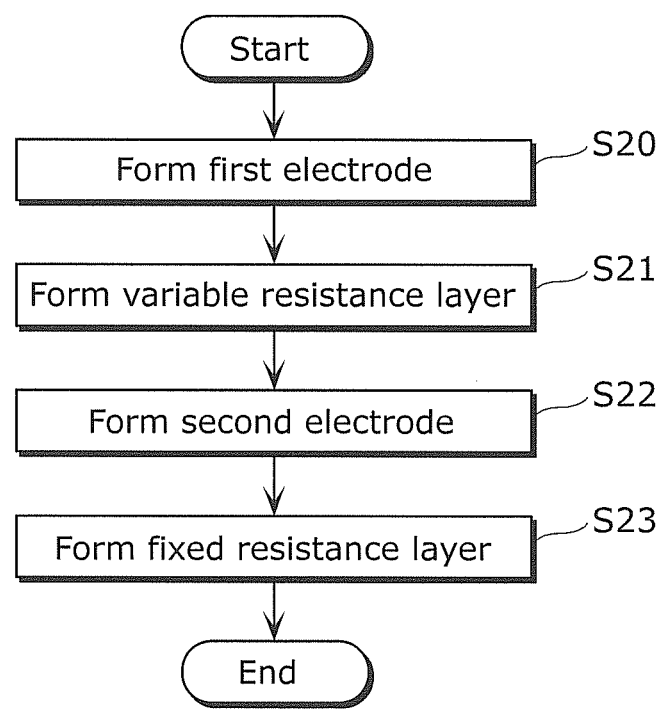
FIG. 13 is a flowchart for describing a method of manufacturing the nonvolatile memory element according to Variation 2 of Embodiment 1 of the present invention.

FIG. 13 is a flowchart for describing a method of manufacturing the nonvolatile memory element according to Variation 2 of Embodiment 1 of the present invention.

First, a first electrode is formed on a semiconductor substrate (S20). Specifically, the oxide layer 102, which has a thickness of 200 nm, comprises $SiO_2$, and serves as an insulating layer, is formed on the substrate 101 with a thermal oxidation method or a CVD method. In addition, as the first electrode layer 103, a TaN thin-film having a thickness of 100 nm is formed on the fixed resistance layer 108.

Next, a variable resistance layer which comprises (i) a first transition metal oxide which is oxygen deficient and (ii) a second transition metal oxide having a higher oxygen content atomic percentage than the first transition metal oxide is formed on the first electrode (S21). Specifically, first, as the first transition metal oxide layer 106 of the variable resistance layer 104, a first tantalum oxide layer is formed on the first electrode layer 103. The thickness of the first tantalum oxide layer ranges from approximately 20 nm to 100 nm. Here, to form the variable resistance layer 104, for example, a reactive RF sputtering method using a Ta target is employed. Note that a sputtering method which does not use a reactive gas such as $O_2$ may be employed to form the variable resistance layer 104, which is possible by using a tantalum oxide as the target. Subsequently, an oxidation process is performed on the first tantalum oxide layer to form, in the top-most surface layer, a second tantalum oxide layer to have a thickness ranging from 2 nm to 12 nm. The second tantalum oxide layer is formed as the second transition metal oxide layer 107 having a higher oxygen content atomic percentage. The variable resistance layer 104 is thus formed on the first electrode layer 103.

Next, a second electrode is formed on a variable resistance layer (S22). Specifically, as the second electrode layer 105, an iridium layer having a thickness of 50 nm is formed on the variable resistance layer 104 with a DC sputtering method.

Lastly, a fixed resistance layer having a predetermined resistance value is formed on the second electrode (S23). Specifically, as the fixed resistance layer 308, a TiAlN thin-film having a thickness of 50 nm is formed on the second electrode layer 105. Here, the resistance value of the fixed resistance layer is approximately 100Ω.

The nonvolatile memory element 300 is manufactured as described above.

Variation 3

Figure 14:
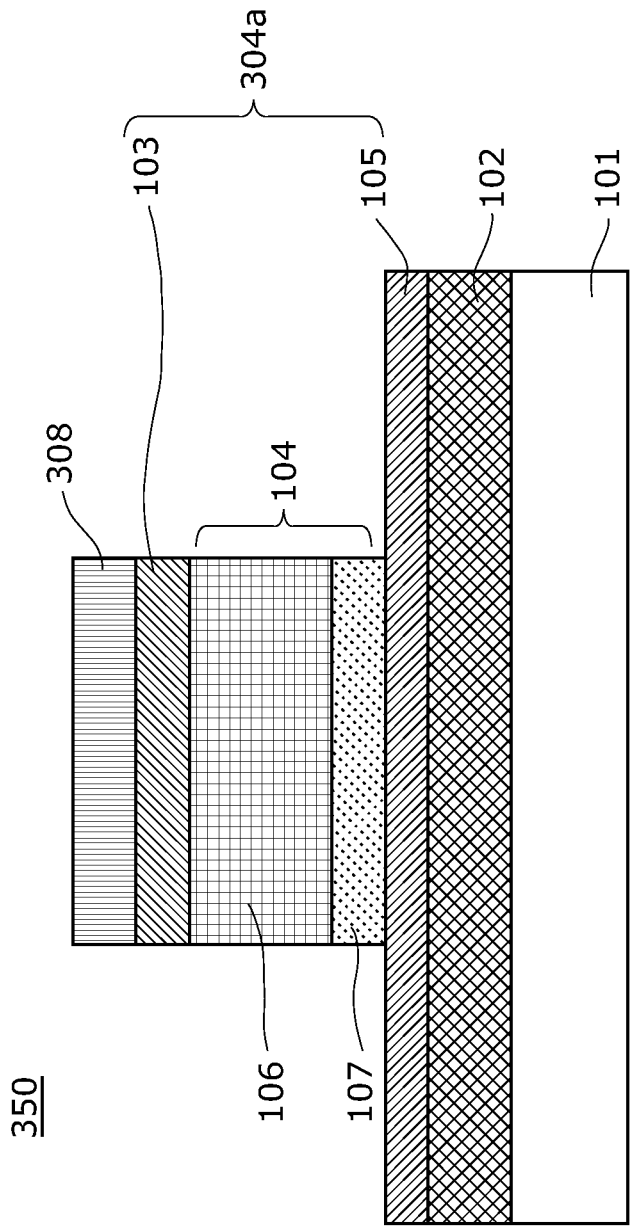
FIG. 14 is a cross-sectional view showing an example structure of a nonvolatile memory element according to Variation 3 of Embodiment 1 of the present invention.

Although it has been described that the nonvolatile memory element 300 shown in FIG. 12 includes the variable resistance element 104a in which the first electrode layer 103, the variable resistance layer 104, and the second electrode layer 105 are sequentially stacked on the oxide layer 102, the variable resistance element 104a is not limited to such an example. As shown in FIG. 14, the variable resistance element 104a of the nonvolatile memory element 300 may be vertically flipped. Here, FIG. 14 is a cross-sectional view showing another example structure of the nonvolatile memory element according to Variation 3 of Embodiment 1 of the present invention. A nonvolatile memory element 350 shown in FIG. 14 has a variable resistance element 304a that has a structure obtained by vertically flipping the variable resistance element 104a of the nonvolatile memory element 300 shown in FIG. 12. Note that the elements same as those in FIG. 1 and FIG. 12 are given the same numerical references, and the detailed descriptions thereof are omitted.

In the structure according to Variation 3, that is, in the nonvolatile memory element 350, another advantageous effect is produced. The fixed resistance layer 308 serves also as an etch stop layer at the time of forming a via hole for connecting a line to the first electrode layer 103.

As described above, the nonvolatile memory element according to Embodiment 1 integrally includes the fixed resistance layer (i.e., stacked). With this, it is possible to lower the initial breakdown voltage by stabilizing a distribution of voltage applied to the high resistance layer having a high oxygen concentration. Accordingly, the thickness of the high concentration layer of the variable resistance layer (the second transition metal oxide layer 107) need not be thinner than required for its resistance value (in other words, the thickness need not be decreased to the level at which the resistance value of the nonvolatile memory element varies). Therefore, it is possible to realize the nonvolatile memory element and the method for manufacturing the nonvolatile memory element which can lower the voltage for the electric pulses required for the initial breakdown and reduce variation in resistance value of the nonvolatile memory element.

Furthermore, the nonvolatile memory element according to Embodiment 1 can stably perform the resistance change operation, because the variable resistance layer 104 is formed in advance with the stacked structure including at least two layers which are (i) the first transition metal oxide layer 106 having a low oxygen content atomic percentage and (ii) the second transition metal oxide layer 107 having a high oxygen content atomic percentage.

Embodiment 2

The nonvolatile memory element according to Embodiment 1 described above can be applied to various forms of nonvolatile semiconductor device. This embodiment describes, as a first example of an application of the nonvolatile memory element according to Embodiment 1, a so-called crosspoint nonvolatile memory device in which the nonvolatile memory element (active layer) is interposed at a crosspoint (three-dimensional crosspoint) between a word line and a bit line.

[Structure of Nonvolatile Memory Device According to First Example of Application]

Figure 15:
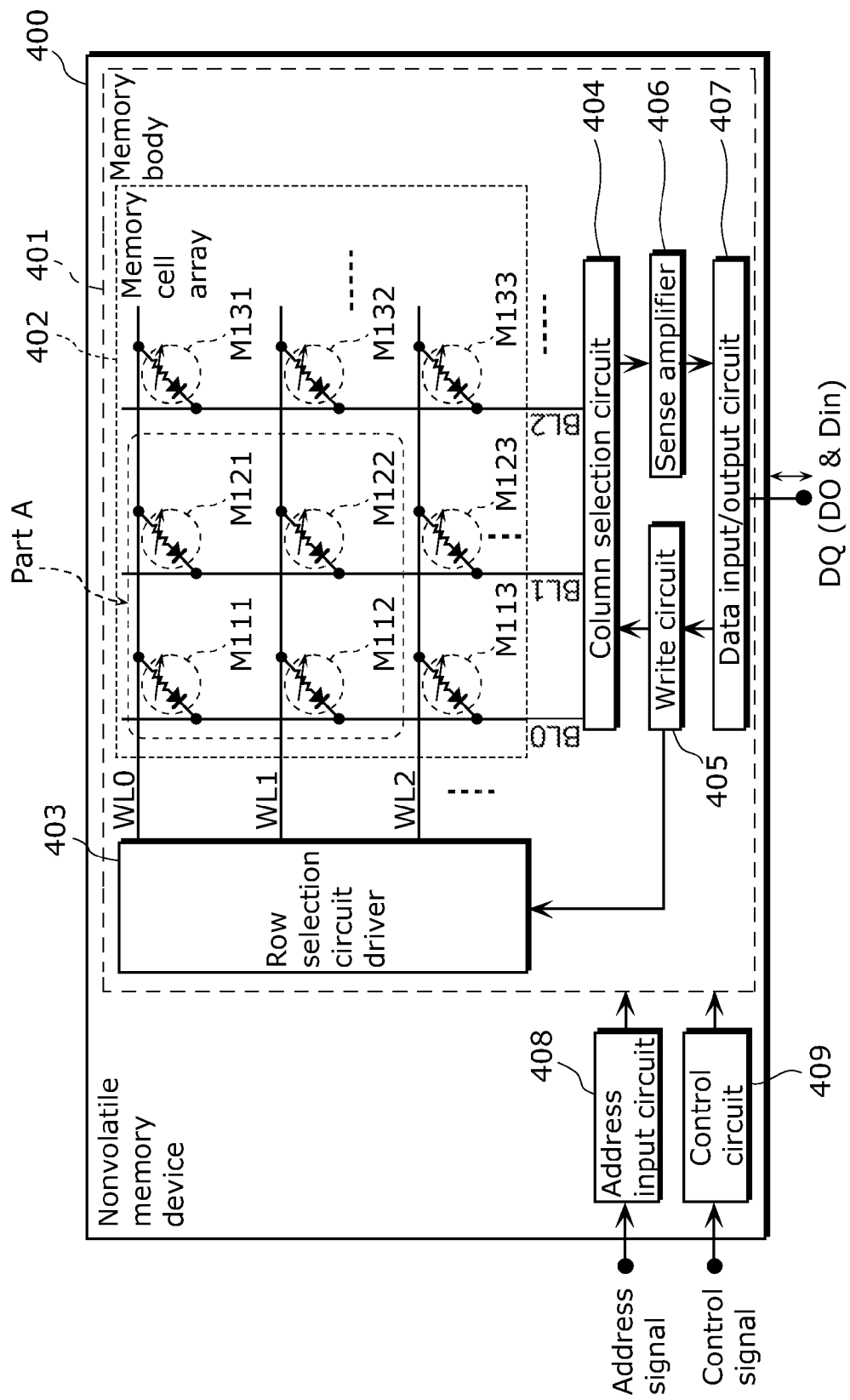
FIG. 15 is a block diagram showing a structure of a nonvolatile memory device according to Embodiment 2 of the present invention.

FIG. 15 is a block diagram showing a structure of the nonvolatile memory device according to Embodiment 2 of the present invention. Furthermore, FIG. 16 is a perspective view showing a structure of Part A (structure for four bits) in the nonvolatile memory device shown in FIG. 15.

The nonvolatile memory device 400 shown in FIG. 15 includes, on a semiconductor substrate, a memory body 401. The memory body 401 includes: a memory cell array 402, a row selection circuit driver 403; a column selection circuit 404; a write circuit 405 for writing information; a sense amplifier 406 which applies a read voltage to a selected bit line, detects an amount of current flowing in the selected bit line, and outputs a signal corresponding to a data "1" or "0"; and a data input/output circuit 407 that executes input and output processing of input and output data via a terminal DQ. Furthermore, the nonvolatile memory device 400 includes: an address input circuit 408 which receives an address signal input from the outside; and a control circuit 409 which controls operation of the memory body 401 based on a control signal input from the outside.

Figure 16:
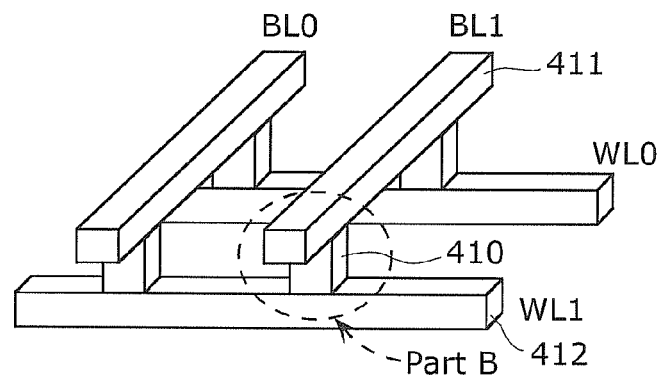
FIG. 16 is a perspective view showing a structure (structure for four bits) of Part A in the nonvolatile memory device shown in FIG. 15.

As shown in FIG. 15 and FIG. 16, the memory cell array 402 includes (i) a plurality of word lines (first lines) WL0, WL1, WL2 . . . formed parallel to each other above the semiconductor substrate, and (ii) a plurality of bit lines (second lines) BL0, BL1, BL2 . . . formed parallel to each other above the word lines WL0, WL1, WL2 . . . in a plane parallel with a major surface of the substrate so as to three-dimensionally cross the word lines WL0, WL1, WL2 . . . .

Moreover, the memory cell array 402 includes, arranged in a matrix, a plurality of memory cells M111, M112, M113, M121, M122, M123, M131, M132, M133 . . . (hereinafter referred to as memory cells M111, M112 . . . ) each of which are deposited to a corresponding three-dimensional crosspoint of the word lines WL0, WL1, WL2 . . . and bit lines BL0, BL1, BL2 . . . .

Here, each of the memory cells M111, M112 . . . includes: the nonvolatile memory element according to Embodiment 1, and a current steering element connected in series to the nonvolatile memory element. In addition, each of the nonvolatile memory elements includes: the variable resistance layer comprising an oxygen-deficient transition metal oxide having a stacked structure; and a fixed resistance layer. Here, a structure of the nonvolatile memory element according to Embodiment 1, which is used in Embodiment 2, is not limited to the structure shown in FIG. 1, but may be structures shown in FIG. 12 and FIG. 14 which are variations of the structure shown in FIG. 1.

Note that each of the memory cells M111, M112, . . . depicted in FIG. 15 is labeled with the reference numeral 410 in FIG. 16.

[Structure of Nonvolatile Memory Element in Nonvolatile Memory Device According to this Embodiment]

Figure 17:
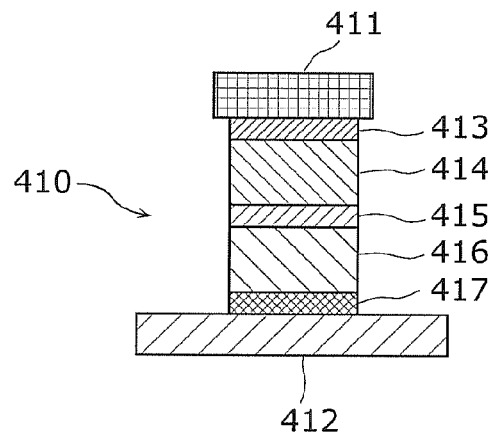
FIG. 17 is a cross-sectional view showing a structure of a nonvolatile memory element in the nonvolatile memory device shown in FIG. 15.

FIG. 17 is a cross-sectional view showing a structure of a nonvolatile memory element of the nonvolatile memory device shown in FIG. 15. Note that FIG. 17 shows the structure of Part B in FIG. 16.

As shown in FIG. 17, in the nonvolatile memory device 400 shown in FIG. 15, a nonvolatile memory element 410 is located between a lower line 412 (corresponds to the word line WL1 in FIG. 16), which is a copper line, and an upper line 411 (corresponds to the bit line BL1 in FIG. 16). The nonvolatile memory element 410 is formed by sequentially stacking a lower electrode 417, a current steering layer 416, an internal electrode 415, a variable resistance layer 414, and an upper electrode 413.

Here, the internal electrode 415, the variable resistance layer 414, and the upper electrode 413 respectively correspond to, for example, the first electrode layer 103, the variable resistance layer 104, and the second electrode layer 105 of the nonvolatile memory element 100 shown in FIG. 1.

Thus, the structure of the nonvolatile memory element according to this embodiment is formed in the same manner as with the structure of the nonvolatile memory element according to Embodiment 1. Note that the structure of the nonvolatile memory element in this embodiment is not limited to the structure described in Embodiment 1, but may be the structures according to the variations of Embodiment 1. In such a case, the nonvolatile memory element may be formed in the same manner as with the forming of the structure of the nonvolatile memory element according to the variation of Embodiment 1.

In other words, when the structure of the nonvolatile memory element in this embodiment has the structure of the nonvolatile memory element shown in FIG. 1, the nonvolatile memory element which can lower the voltage for electric pulses required for the initial breakdown can be configured by forming the fixed resistance layer 108 below the first electrode layer 103 (the internal electrode 415). When the structure of the nonvolatile memory element in this embodiment is the structure of the nonvolatile memory element shown in FIG. 11, the fixed resistance layer 108 may be formed below the second electrode layer 105 (the internal electrode 415). Furthermore, when the structure of the nonvolatile memory element in this embodiment is the structure of the nonvolatile memory element shown in FIG. 12, the fixed resistance layer 308 may be formed above the second electrode layer 105 (the upper electrode 413). Furthermore, when the structure of the nonvolatile memory element in this embodiment is the structure of the nonvolatile memory element shown in FIG. 14, the fixed resistance layer 308 may be formed above the first electrode layer 103 (the upper electrode 413).

The current steering layer 416 is connected in series with the variable resistance layer 414 via the inner electrode 415 which comprises TaN. The current steering layer 416 and the variable resistance layer 414 are electrically connected. The current steering element including the lower electrode 417, the current steering layer 416, and the internal electrode 415 is an element which is typified by a metal-insulator-metal (MIM) diode or a metal-semiconductor-metal (MSM) diode, and shows nonlinear current characteristics for a voltage. A larger amount of current can flow in the MSM diode than in the MIM diode. As the current steering layer 416, an insulator, SiN, amorphous Si, or the like can be used. Furthermore, the current steering element has bi-directional current characteristics for a voltage, and is configured to be conductive at a predetermined threshold voltage Vf (+1 V or higher or −1 V or lower with reference to one of electrodes, for example). Furthermore, the predetermined threshold voltage Vf may be different for each of a positive side voltage and a negative side voltage.

Note that tantalum and a tantalum oxide are materials generally used in existing semiconductor processes, and have very high affinity with the existing semiconductor processes. Therefore, it is possible to easily use these materials in the existing semiconductor manufacturing processes.

[Example of Structure of Nonvolatile Memory Device having Multi-Layered Structure]

It is possible to implement a nonvolatile memory device having a multi-layered structure, by three-dimensionally stacking the memory cell array in the nonvolatile memory device shown in FIG. 15 and FIG. 16. The following describes the nonvolatile memory device having a multi-layered structure.

Figure 18:
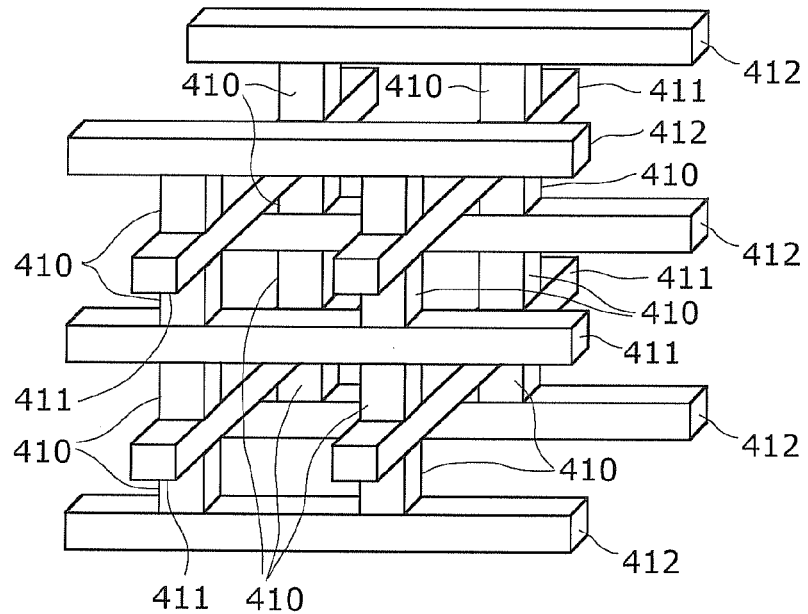
FIG. 18 is a perspective view showing a structure of a memory cell array in which multiple layers of the nonvolatile memory device shown in FIG. 15 are stacked.

FIG. 18 is a perspective view showing a structure of a memory cell array in which the multiple layers of the memory cell array shown in FIG. 15 are stacked. The nonvolatile memory device shown in FIG. 18 includes a multi-layered memory cell array which is formed by stacking a plurality of layers of a memory cell array which includes: a plurality of the lower lines (first lines) 412 formed parallel to each other above the semiconductor substrate not illustrated in the drawing; a plurality of the upper lines (second lines) 411 formed above the lower lines 412 so as to (i) be parallel to each other in a plane parallel with a major surface of the semiconductor substrate and (ii) three-dimensionally cross the lower lines 412; and a plurality of memory cells (the nonvolatile memory elements 410) provided in matrix, corresponding to the points where the lower lines 412 and the upper lines 411 three-dimensionally intersect with each other.

Note that the example shown in FIG. 18 includes: five layers of the line layer; and the four layers of the nonvolatile memory element which are disposed at three-dimensional crosspoints. However, it is apparent that the number of layers may be increased or decreased as necessary.

By utilizing a mufti-layered memory cell array configured in such a way, it is possible to implement an ultra large-capacity nonvolatile memory.

Note that, as described in Embodiment 1, the variable resistance layer according to an implementation of the present invention can be formed at low temperature. Therefore, even when stacking is performed in line processing described in Embodiment 1, a transistor formed in processing for a lower layer and a line material such as silicide is not affected. Thus, the multi-layered memory cell array can be easily implemented. In other words, the nonvolatile memory device having a multi-layered structure can be easily implemented by using the variable resistance layer including a tantalum oxide according to an implementation of the present invention.

Embodiment 3

This embodiment describes, as a second example of an application of the nonvolatile memory element according to the above-described Embodiment 1, a nonvolatile memory device having a one-transistor and one-nonvolatile memory element structure (1T1R structure).

[Nonvolatile Memory Device Structure According to this Embodiment]

Figure 19:
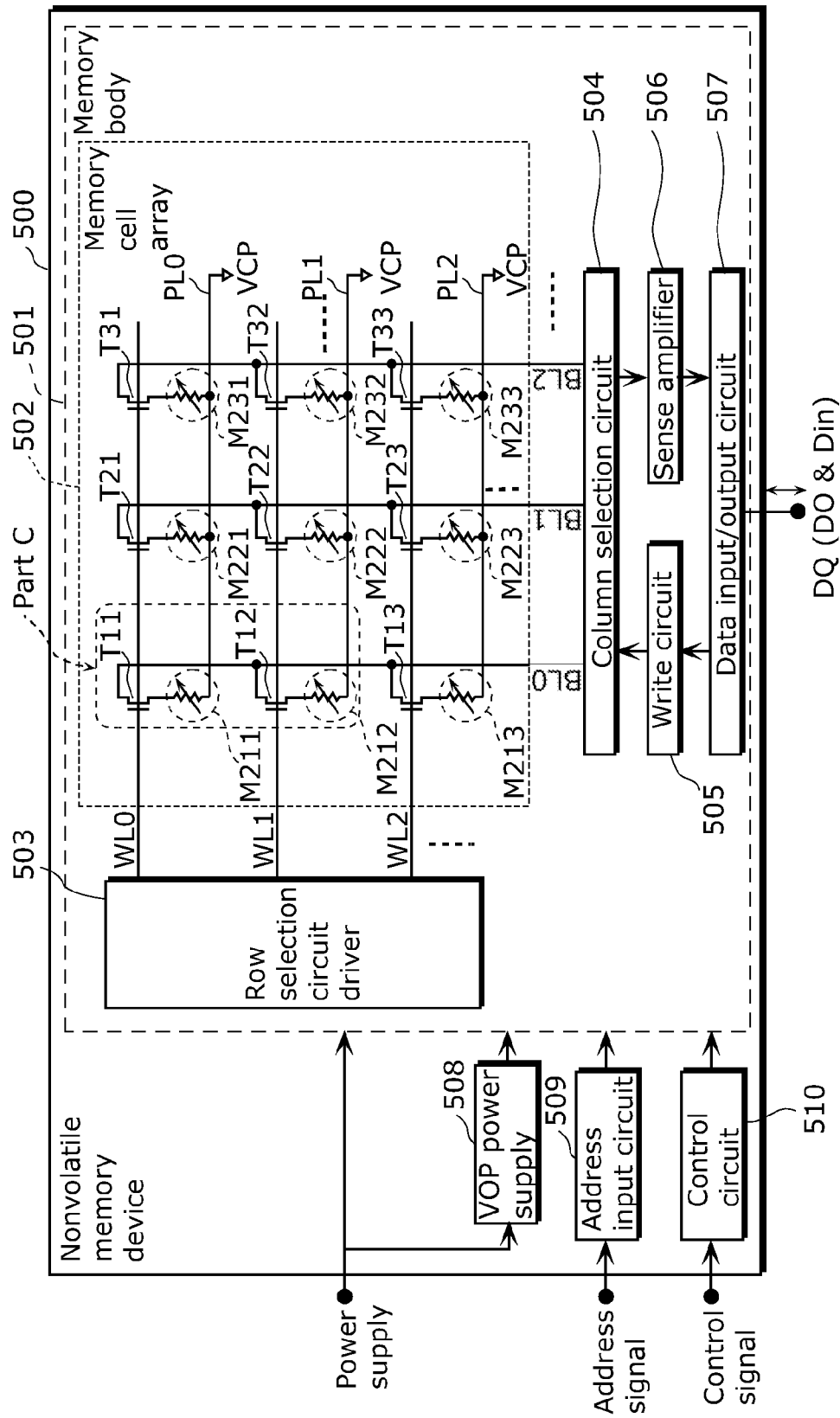
FIG. 19 is a block diagram showing a structure of the nonvolatile memory device according to Embodiment 3 of the present invention.
Figure 20:
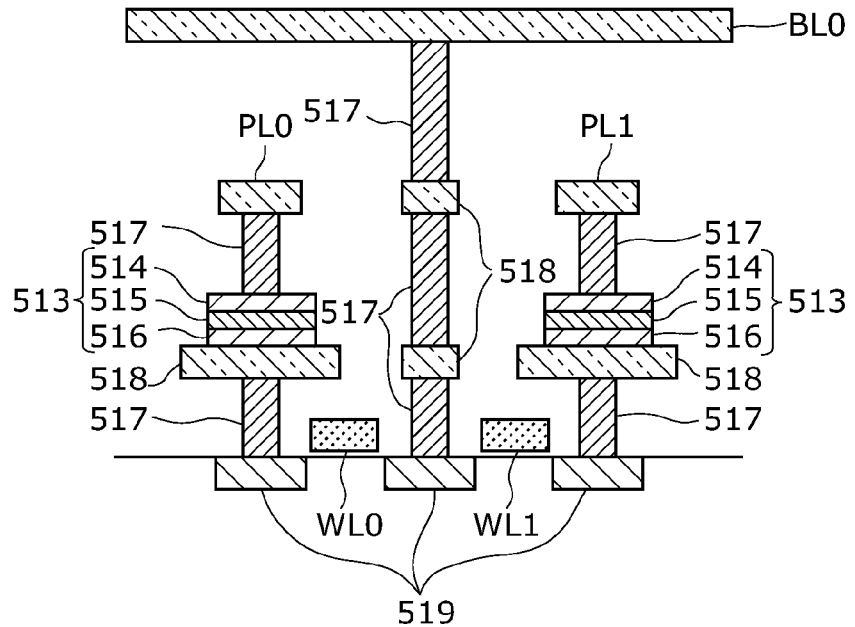
FIG. 20 is a cross-sectional view showing a structure (structure for two bits) of Part C in the nonvolatile memory device shown in FIG. 19.

FIG. 19 is a block diagram showing a structure of the nonvolatile memory device according to Embodiment 3 of the present invention. Furthermore, FIG. 20 is a cross-sectional view showing a structure of Part C (structure for two bits) in the nonvolatile memory device shown in FIG. 19.

A nonvolatile memory device 500 shown in FIG. 19 includes, on a semiconductor substrate, a memory body 501. The memory body 501 includes: a memory cell array 502; a row selection circuit driver 503; a column selection circuit 504; a write circuit 505 for writing information; a sense amplifier 506 which detects an amount of current flowing in the selected bit line, and determines whether the data indicates "1" or "0"; and a data input/output circuit 507 that executes input and output processing of input and output data via a terminal DQ. Furthermore, the nonvolatile memory device 500 further includes: a cell plate power source (VCP power source) 508; an address input circuit 509 which receives an address signal input from the outside; and a control circuit 510 which controls operation of the memory body 501 based on a control signal input from the outside.

The memory cell array 502 includes: word lines (the first lines) WL0, WL1, WL2, . . . and bit lines (the second lines) BL0, BL1, BL2, . . . which are formed on the semiconductor substrate and arranged to cross with each other; transistors T11, T12, T13, T21, T22, T23, T31, T32, T33, . . . (hereinafter, referred to as "transistors T11, T12, ..." ) each of which is provided to correspond to a corresponding one of crosspoints of the word lines WL0, WL1, WL2, ... and the bit lines BL0, BL1, BL2, ... ; and memory cells M211, M212, M213, M221, M222, M223, M231, M232, M233, ... (hereinafter, referred to as "memory cells M211, M212, ... ") each of which is provided to correspond to the transistors T11, T12, ... on a one-on-one basis.

Furthermore, the memory cell array 502 includes plate lines (third lines) PL0, PL1, PL2, ... arranged parallel to the word lines WL0, WL1, WL2, ... As shown in FIG. 20, the bit line BL0 is arranged above the word lines WL0 and WL1, and the plate lines PL0 and PL1 are arranged between the word lines WL0 and WL1, and the bit line BL0.

Here, each of the memory cells M211, M212, ... corresponds to the nonvolatile memory elements according to Embodiment 1 and the variations of Embodiment 1. Each of the nonvolatile memory elements includes (i) the variable resistance layer comprising an oxygen-deficient transition metal oxide having a stacked structure and (ii) the fixed resistance layer. More specifically, a nonvolatile memory element 513 in FIG. 20 corresponds to each of the memory cells M211, M212, ... in FIG. 19. The nonvolatile memory element 513 includes: an upper electrode 514, a variable resistance layer 515 comprising an oxygen-deficient transition metal oxide having a stacked structure, and a lower electrode 516. It is possible to configure a nonvolatile memory element which can lower the voltage for the electric pulses required for the initial breakdown, by forming the fixed resistance layer described in Embodiment 1 either above the upper electrode 514 or below the lower electrode 516.

In FIG. 20, note that 517 indicates a plug layer, 518 indicates a metal line layer, and 519 indicates a source region or a drain region of a transistor.

As shown in FIG. 19, drains of the transistors T11, T12, T13, ..., drains of the transistors T21, T22, T23, ..., and drains of the transistors T31, T32, T33, ... are connected to the bit line BL0, the bit line BL1, and the bit line BL2, respectively. Furthermore, gates of the transistors T11, T21, T31, ..., gates of the transistors T12, T22, T32, ..., and gates of the transistors T13, T23, T33, ... are connected to the word line WL0, the word line WL1, and the word line WL2, respectively. Furthermore, each of sources of the transistors T11, T12, ... is connected to a corresponding one of the memory cells M211, M212, ....

Furthermore, the memory cells M211, M221, M231, ..., the memory cells M212, M222, M232, ..., and the memory cells M213, M223, M233, ... are connected to the plate line PL0, the plate line PL1, and the plate line PL2, respectively. Although each of the plate lines are connected to a fixed potential VCP in FIG. 19, a driver may be disposed for each of the plate lines so that a different voltage can be outputted to each of the plate lines.

The address input circuit 509 receives an address signal from an external circuit (not shown), and based on this address signal, outputs a row address signal to the row selection circuit driver 503, and also outputs a column address signal to the column selection circuit 504. Here, the address signal is a signal that indicates the address of a specific memory cell that is selected from among the memory cells M211, M212, .... Further, the row address signal is a signal that indicates the row address of the address indicated in the address signal, whereas the column address signal is a signal that indicates the column address of the address indicated in the address signal.

The control circuit 510 outputs, to the write circuit 505, a write command signal for instructing application of a write voltage, according to input data Din received by the data input/output circuit 507, in an information write cycle. On the other hand, the control circuit 510 outputs, to the sense amplifier 506, a read command signal for instructing application of a read voltage in an information read cycle.

The row selection circuit driver 503 receives the row address signal output from the address input circuit 509, selects one of the word lines WL0, WL1, WL2 ... according to this row address signal, and applies a predetermined voltage to the selected word line.

The column selection circuit 504 receives the column address signal output from the address input circuit 509, selects one of the bit lines BL0, BL1, BL2, ... according to this column address signal, and applies a write voltage or a read voltage to the selected bit line.

In receiving a write command signal from the control circuit 510, the write circuit 505 outputs a write voltage to the bit line selected by the column selection circuit 504.

In the information read cycle, the sense amplifier 506 applies the read voltage to the selected bit line to be read, detects an amount of current flowing, and outputs a signal which corresponds to data "1" or "0". The resulting output data DO is output to an external circuit via the data input/output circuit 507.

Note that this embodiment in which the memory cell has a 1T1R structure has smaller storage capacity as compared to storage capacity of the cross point nonvolatile memory element according to Embodiment 2. However, since the 1T1R memory cell has superior on-off characteristics as compared to the current steering element such as a diode, this embodiment is advantageous in that various disturbs due to a sneak current do not have to be considered in designing and it is easy to control operations. Furthermore, another advantage is that the 1T1R memory cell can be easily incorporated into a CMOS process.

Furthermore, as with Embodiment 2, the variable resistance layer according to an implementation of the present invention can be formed at low temperature. Thus, it is advantageous in that, even when stacking is performed in line processing described in Embodiment 1, a transistor formed in processing for a lower layer and a line material such as silicide is not affected.

Further, as with Embodiment 2, tantalum and tantalum oxide can be easily formed in the existing semiconductor manufacturing processes. Thus, the nonvolatile memory device according to this example of application can be easily manufactured.

[Measurement Results of Nonvolatile Memory Device According to this Embodiment]

Next, initial breakdown voltage characteristics of the variable resistance layer (the nonvolatile memory element which includes a transistor) in the nonvolatile memory device according to this embodiment are measured, and a dependency of the fixed resistance layer provided below the lower electrode 516 which corresponds to the first electrode layer 103 is examined.

Figure 21:
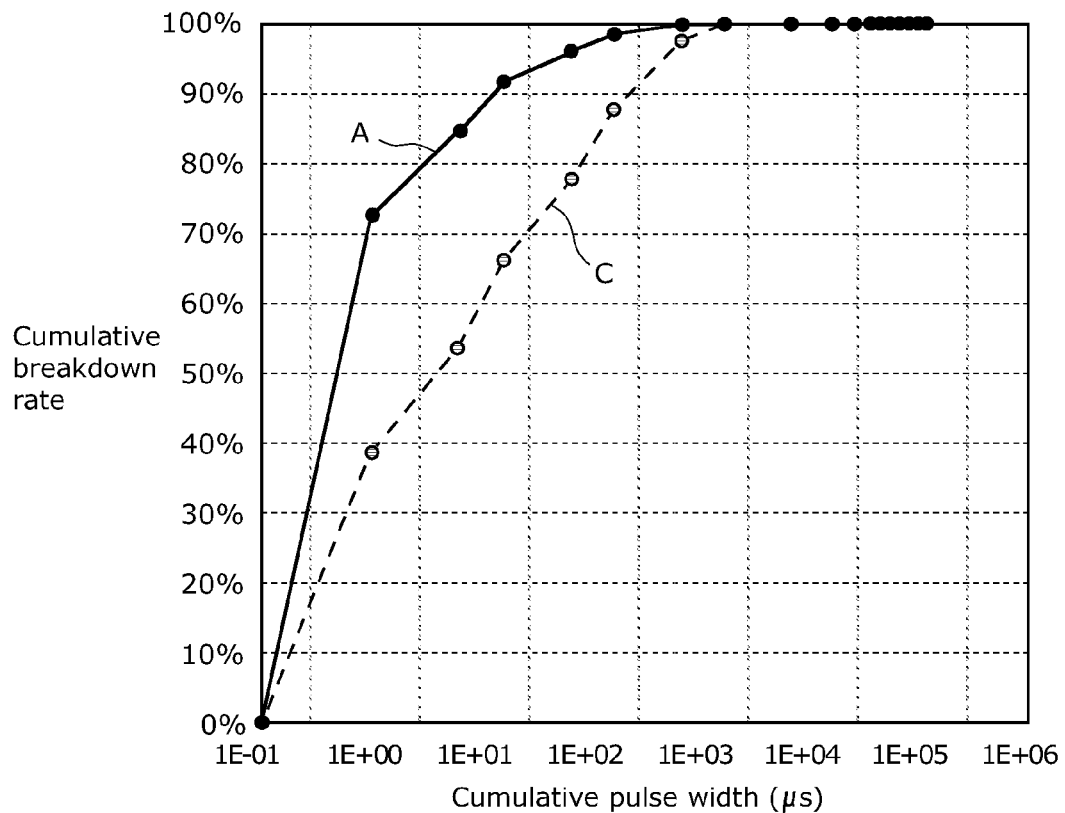
FIG. 21 is a comparison diagram showing a result of evaluation of initial breakdown times of a nonvolatile memory element of the nonvolatile memory device according to Embodiment 3 of the present invention and a nonvolatile memory element of a nonvolatile memory device according to a conventional example.

FIG. 21 is a comparison diagram showing results of evaluation of initial breakdown times of the nonvolatile memory element of the nonvolatile memory device according to Embodiment 3 of the present invention and a nonvolatile memory element of a nonvolatile memory device according to a conventional example. The horizontal axis indicates a pulse width (cumulative value) required for the initial breakdown of the nonvolatile memory element. The vertical axis indicates a cumulative breakdown rate. In FIG. 21, the solid line A shows the result of the evaluation of the initial breakdown time of the nonvolatile memory element of the nonvolatile memory device according to this embodiment, and the broken line C shows the result of the evaluation of the initial breakdown time of the nonvolatile memory element of the nonvolatile memory device according to the conventional example. The result shown in FIG. 21 indicates that, in the memory cell array according to this embodiment including the fixed resistance, breakdown occurs earlier than in the memory cell array according to the conventional example. Specifically, it is shown that providing the fixed resistance layer integrally with the variable resistance element of the nonvolatile memory element allows for the lowering of the initial breakdown voltage.

Embodiment 4

Next, an embodiment of a design support method for a nonvolatile memory element according to the present invention is described.

Figure 22:
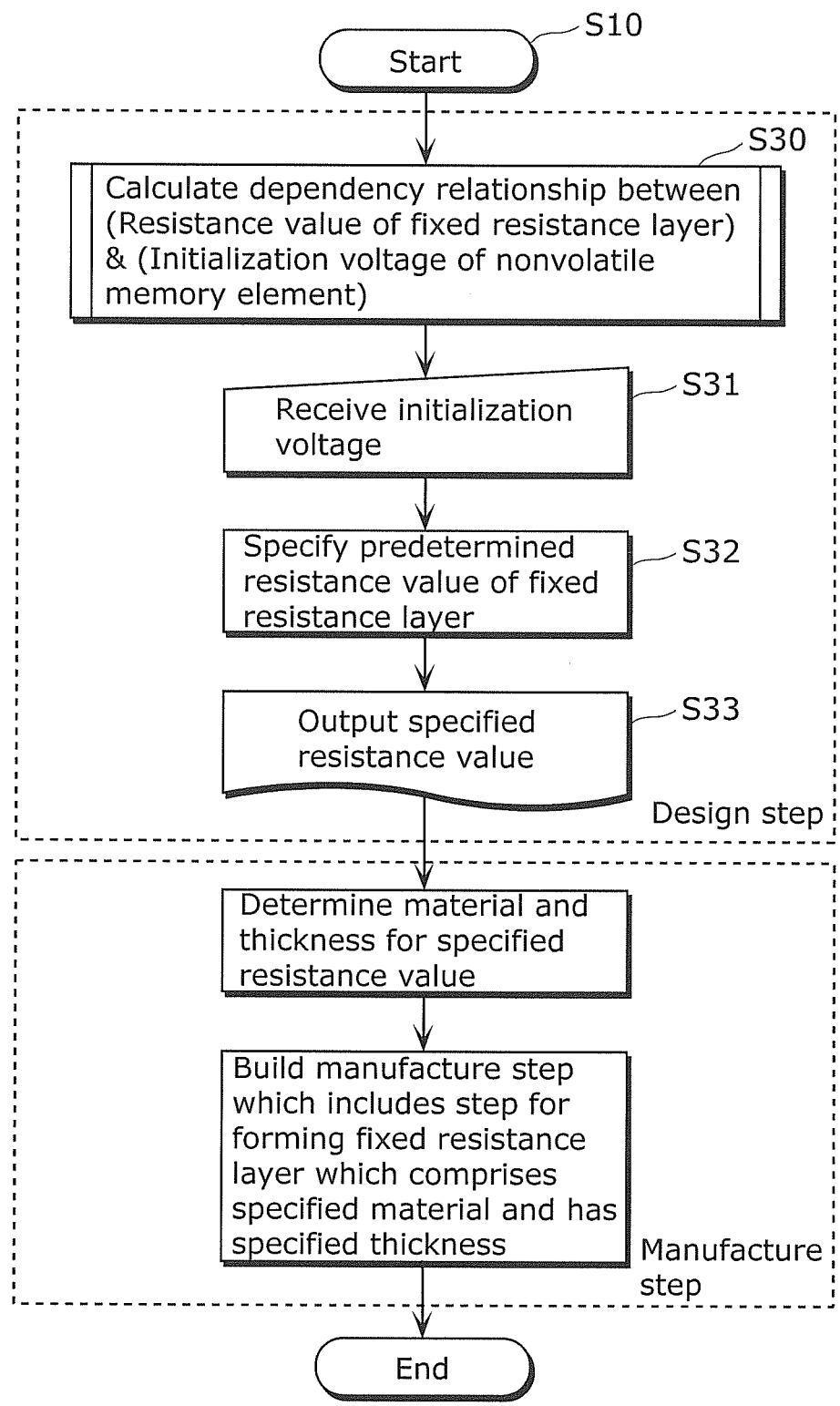
FIG. 22 is a flowchart showing an entire procedure in a design support method for a nonvolatile memory element according to Embodiment 4 of the present invention.
Figure 23:
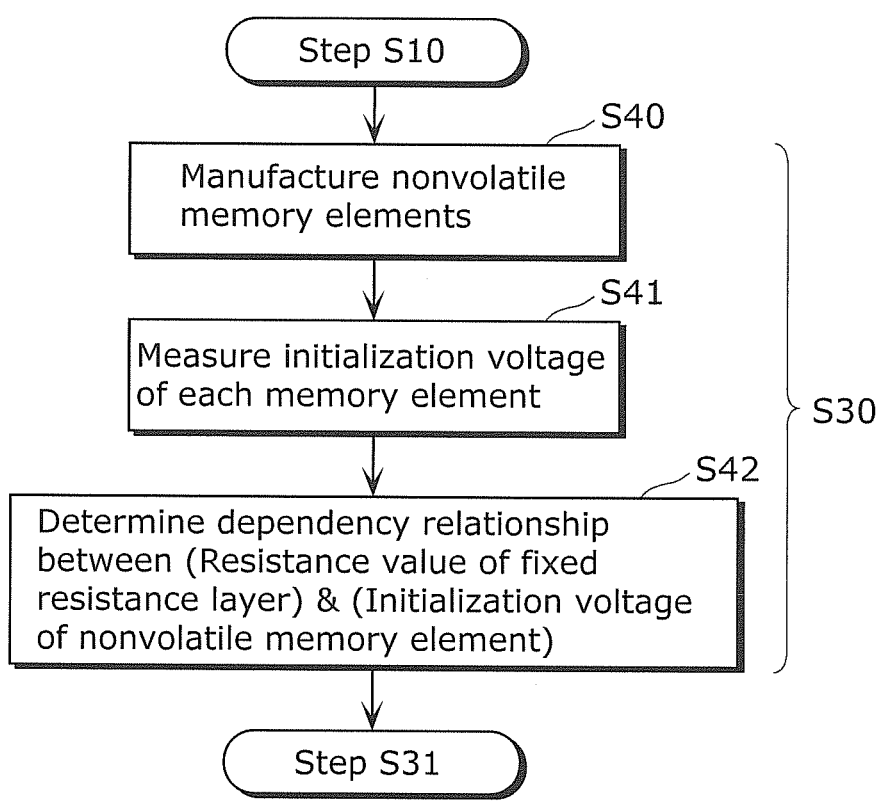
FIG. 23 is a flowchart showing a detailed procedure in Step S10 of FIG. 22.

FIG. 22 is a flowchart showing an entire procedure in a design support method for the nonvolatile memory element according to Embodiment 4 of the present invention. FIG. 23 is a flowchart showing a procedure of Step S30 of the design support method shown in FIG. 22.

This design support method is a method of supporting design of the nonvolatile memory element according to Embodiment 1, and in more detail, is a method of determining a predetermined resistance value of the fixed resistance layer which satisfies requirements when the nonvolatile memory element to be designed receives a required initial breakdown voltage (initialization voltage).

The design support method of the nonvolatile memory element shown in FIG. 22 includes: a design step in which the predetermined resistance value of the fixed resistance layer is determined; and a manufacture step in which the nonvolatile memory element is manufactured according to the predetermined resistance value determined in the design step. Specifically, in the design step, the dependency relationship shown in FIG. 6 is calculated in advance, that is, the dependency relationship between the resistance value of the fixed resistance layer and the initialization voltage of the nonvolatile memory element which includes the fixed resistance layer is calculated, by preparing a semiconductor chip for testing (S30). In the semiconductor chip for testing, a fixed resistance layers having various resistance values integral with the nonvolatile memory elements are formed. The initialization voltages of the prepared nonvolatile memory elements having various fixed resistance values are measured. Next, the initialization voltage (design specification) required for the nonvolatile memory element to be designed is received (S31). Next, by referring to the dependency relationship calculated in Step S30, the predetermined resistance value of the fixed resistance layer which corresponds to the received initialization voltage is specified (S32). Lastly, the specified resistance value is outputted (S33).

Here, in more detail, the above-described calculation of the dependency relationship (S30) is implemented through the procedure shown in FIG. 23. In other words, nonvolatile memory elements which include fixed resistance layers having mutually different resistance values are experimentally manufactured in advance (S40). Next, the experimentally manufactured nonvolatile memory elements which include fixed resistance layers having mutually different resistance values are initialized so as to measure and collect the initialization voltage of each of the nonvolatile memory elements (S41). Lastly, for each of the nonvolatile memory elements, each of the resistance values of the fixed resistance layers and the corresponding one of the initialization voltages are associated with each other and plotted. Thus, the dependency relationship between the resistance value of the fixed resistance layer and the initialization voltage of the nonvolatile memory element including the fixed resistance layer is determined (S42).

On the other hand, in the manufacture step, first, a material and a thickness for the specified resistance value are determined. Then, a manufacture step, which includes the step for forming the fixed resistance layer which comprises the specified material and have the specified thickness, is built. The method of manufacturing performed in the manufacture step is described in the above, and thus the descriptions thereof are omitted here.

Such a design support method can be implemented as a program which is executed by a computer. Specifically, a processor included in a computer execute the design support program to obtain a combination of the resistance value of the fixed resistance layer and the initialization voltage of each of the nonvolatile memory elements from a user via an input element, such as a keyboard, (S30) stores the obtained data as the above dependency relationship in a memory device, such as a hard disk, (S31) receives the required initialization voltage for the nonvolatile memory element to be designed, from a user via the input element, such as a keyboard, (S32) specifies the predetermined resistance value of the fixed resistance layer which corresponds to the received initialization voltage, with reference to the dependency relationship stored in the memory device, and (S33) outputs the specified resistance value to a display or the like. Regarding the dependency relationship, the processor may store, as the above dependency relationship, an approximate curve calculated by the least square method or the like using the combination of the resistance value of the fixed resistance layer and the initialization voltage inputted by a user.

Although the nonvolatile memory element, the method of manufacturing the nonvolatile memory element, and the design support method for the nonvolatile memory element according to implementations of the present invention are described thus far based on the embodiments, the present invention is not limited to these embodiments. Embodiments obtained by applying various changes that may be conceived by a person skilled in the art to the embodiments and embodiments resulting from any combinations of components of the embodiments are also included in the present invention.

Note that although the transition metal oxide layer has a stacked structure comprising the tantalum oxide in the above-described embodiments, the transition metal oxide layer is not limited to such an example. Alternatively, for example, the transition metal oxide layer may have a stacked structure comprising a hafnium (Hf) oxide or a stacked structure comprising a zirconium (Zr) oxide. Such stacked structures have initial resistance approximate to the order ($10^7$ to $10^8\Omega$) of the initial resistance value of the stacked structure comprising the tantalum oxide, and thus it is considered that the similar advantageous effect is produced. In other words, it is considered that the advantageous effect of lowering the electric pulses required for the initial breakdown can be produced, by integrally including the fixed resistance layer having a fixed resistance value ranging from 70$\Omega$ to 1000$\Omega$ inclusive with the nonvolatile memory element configured of a stacked structure comprising the hafnium (Hf) oxide or a stacked structure comprising the zirconium (Zr) oxide.

When the stacked structure comprising the hafnium oxide is adopted and the first transition metal oxide and the second transition metal oxide included in the stacked structure are respectively represented by $HfO_x$ and $HfO_y$, it is preferable that $0<x<2$ and $x<y$ be satisfied and the thickness of the second hafnium oxide be in a range from 3 nm to 4 nm inclusive.

Furthermore, when the stacked structure comprising the zirconium oxide is adopted and the first transition metal oxide and the second transition metal oxide are respectively represented by $ZrO_x$ and $ZrO_y$, it is preferable that $0<x<2$ and $x<y$ be satisfied and the thickness of the second transition oxide be in a range from 1 nm to 5 nm inclusive.

In the case of the hafnium oxide, a Hf target is used. What is called the reactive sputtering method is employed so that the hafnium oxide is deposited, by sputtering the Hf target in a mixture of argon and oxygen plasma. The first transition metal oxide is thus formed on the lower electrode. The second transition metal oxide can be formed after forming the first transition metal oxide, by oxidizing the surface of the first transition metal oxide. For example, the second transition metal oxide can be formed by exposing the surface of the first transition metal oxide to the mixture of argon and oxygen plasma. Furthermore, the second transition metal oxide may be formed by sputtering using a $HfO_2$ target. The oxygen content atomic percentage of the first transition metal oxide can be easily adjusted by changing the flow ratio of the oxygen gas to the argon gas in the reactive sputtering, in the same manner as in the case of the above-described tantalum oxide. It should be noted that, with regard to the substrate temperature, heating is not necessary and room temperature is acceptable.

Furthermore, when the first transition metal oxide is a hafnium oxide, the thickness of the second transition metal oxide can be easily adjusted through the exposure time to the argon gas and oxygen gas plasma. When the compositions of the first transition metal oxide and the second transition metal oxide are respectively represented by $HfO_x$ and $HfO_y$, it is possible to realize stable resistance change characteristics when x and y respectively approximately satisfies $0.9 \leq x \leq 1.6$ and $1.8 < y < 2.0$, and the thickness of the second transition metal oxide is in a range from 3 nm to 4 nm inclusive.

In the case of the zirconium oxide, a Zr target is used. What is called the reactive sputtering method is employed so that the Zr target is sputtered in a mixture of argon and oxygen plasma. The first transition metal oxide is thus formed on the lower electrode. The second transition metal oxide can be formed after forming the first transition metal oxide, by oxidizing the surface of the first transition metal oxide. For example, the second transition metal oxide can be formed by exposing the surface of the first transition metal oxide to the mixture of argon and oxygen plasma. Furthermore, the second transition metal oxide may be formed by sputtering using a $ZrO_2$ target. The oxygen content atomic percentage of the first transition metal oxide can be easily adjusted by changing the flow ratio of the oxygen gas to the argon gas in the reactive sputtering, in the same manner as in the case of the above-described tantalum oxide. It should be noted that, with regard to the substrate temperature, heating is not necessary and room temperature is acceptable.

Furthermore, in the case of the zirconium oxide, the thickness of the second transition metal oxide can be easily adjusted through the exposure time to the mixture of argon and oxygen plasma. When the compositions of the first transition metal oxide and the second transition metal oxide are respectively represented by $ZrO_x$ and $ZrO_y$, it is possible to realize stable resistance change characteristics when x and y respectively approximately satisfies $0.9 \leq x \leq 1.4$ and $1.9 < y < 2.0$, and the thickness of the second transition metal oxide is in a range from 1 nm to 5 nm inclusive.

The above embodiments described the case in which the transition metal oxide as the variable resistance layer comprises the tantalum oxide, the hafnium oxide, and the zirconium oxide. However, note that the transition metal oxide layer held between the first electrode and the second electrode only needs to include an oxide layer of tantalum, hafnium, zirconium, or the like as a primary variable resistance layer which causes a change in resistance, and thus may contain a small amount of other chemical elements. It is also possible to add a small amount of other chemical elements on purpose to make a fine control on a resistance value, which is also included in the scope of the present invention. For example, adding nitrogen to a variable resistance layer increases the resistance value of the variable resistance layer so that the reactivity of resistance change is increased.

Furthermore, there may be the case where a small amount of an element may be unintentionally mixed into a variable resistance layer due to residual gas or gas released from the wall of a vacuum chamber when the variable resistance layer is formed by sputtering. Such a case where a small amount of an element is mixed into a resistive film is also within the scope of the present invention as a matter of course.

INDUSTRIAL APPLICABILITY

The present invention provides a variable resistance semiconductor memory element and a nonvolatile memory device including the same, and is useful in various electronic devices that use a nonvolatile memory because the present invention can realize a nonvolatile memory which operates in a stable manner and is highly reliable.

REFERENCE SIGNS LIST

100, 150, 200, 300, 350, 410, 513 Nonvolatile memory element
101 Substrate
102 Oxide layer
103 First electrode layer
104, 414, 515 Variable resistance layer
104a, 154a, 304a Variable resistance element
105 Second electrode layer
106 First transition metal oxide layer
107 Second transition metal oxide layer
108, 308 Fixed resistance layer
400, 500 Nonvolatile memory device
401, 501 Memory body
402, 502 Memory cell array
403, 503 Row selection circuit driver
404, 504 Column selection circuit
405, 505 Write circuit
406, 506 Sense amplifier
407, 507 Data input/output circuit
408, 509 Address input circuit
409, 510 Control circuit
411 Upper line
412 Lower line
413, 514 Upper electrode
415 Internal electrode
416 Current steering layer
417, 516 Lower electrode
508 Cell plate power source

The invention claimed is:
1. A nonvolatile memory element comprising:
a variable resistance element including a first electrode, a second electrode, and a variable resistance layer which is located between the first electrode and the second electrode and has a resistance value that reversibly changes based on an electrical signal applied between the first electrode and the second electrode; and a fixed resistance layer stacked together with the variable resistance element, the fixed resistance layer (i) for reducing an initial breakdown voltage of the variable resistance element in an initial state, and (ii) having a predetermined resistance value, wherein the variable resistance layer includes (i) a first transition metal oxide layer which comprises an oxygen-deficient transition metal oxide and (ii) a second transition metal oxide layer which has an oxygen content atomic percentage that is higher than an oxygen content atomic percentage of the first transition metal oxide layer, and the predetermined resistance value ranges from 70Ω to 1000Ω inclusive.

2. The nonvolatile memory element according to claim 1, wherein the first electrode is disposed on the fixed resistance layer, the first transition metal oxide layer is disposed on the first electrode, the second transition metal oxide layer is disposed on the first transition metal oxide layer, the second electrode is disposed on the second transition metal oxide layer, and the fixed resistance layer is electrically connected to the variable resistance element.

3. The nonvolatile memory element according to claim 1, wherein the fixed resistance layer is disposed on the second electrode, the second electrode is disposed on the second transition metal oxide layer, the second transition metal oxide layer is disposed on the first transition metal oxide layer, the first transition metal oxide layer is disposed on the first electrode, and the fixed resistance layer is electrically connected to the variable resistance element.

4. The nonvolatile memory element according to claim 1, wherein the second electrode is disposed on the fixed resistance layer, the second transition metal oxide layer is disposed on the second electrode, and the first transition metal oxide layer is disposed on the second transition metal oxide layer, the first electrode is disposed on the second transition metal oxide layer, and the fixed resistance layer is electrically connected to the variable resistance element.

5. The nonvolatile memory element according to claim 1, wherein the fixed resistance layer is disposed on the first electrode, the first electrode is disposed on the first transition metal oxide layer, the first transition metal oxide layer is disposed on the second transition metal oxide layer, the second transition metal oxide layer is disposed on the second electrode, and the fixed resistance layer is electrically connected to the variable resistance element.

6. The nonvolatile memory element according to claim 1, wherein the second electrode comprises a material having a standard electrode potential that is higher than both a standard electrode potential of a material comprised in the first electrode and a standard electrode potential of a transition metal comprised in the variable resistance layer.

7. The nonvolatile memory element according to claim 1, wherein the variable resistance layer includes one transition metal oxide layer which comprises an oxygen-deficient transition metal oxide selected from a tantalum oxide, a hafnium oxide, and a zirconium oxide.

8. The nonvolatile memory element according to claim 1, wherein the predetermined resistance value ranges from 70Ω to 420Ω inclusive.

9. The nonvolatile memory element according to claim 1, wherein the fixed resistance layer comprises titanium aluminum nitride.

10. The nonvolatile memory element according to claim 1, wherein the fixed resistance layer comprises a tantalum oxide.

* * * * *